United States Patent
Gan

(10) Patent No.: US 8,587,382 B2
(45) Date of Patent: *Nov. 19, 2013

(54) DEVICE, SYSTEM, AND METHOD OF FREQUENCY GENERATION USING AN ATOMIC RESONATOR

(75) Inventor: Lahav Gan, Megadim (IL)

(73) Assignee: Dimension 4 Ltd., Atlit (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/597,369

(22) Filed: Aug. 29, 2012

(65) Prior Publication Data

US 2012/0326793 A1    Dec. 27, 2012

Related U.S. Application Data

(63) Continuation of application No. 12/866,264, filed as application No. PCT/IL2009/000131 on Feb. 5, 2009, now Pat. No. 8,299,858.

(60) Provisional application No. 61/026,744, filed on Feb. 7, 2008.

(51) Int. Cl.
*H03L 7/26* (2006.01)
*H01S 1/02* (2006.01)
*H03B 17/00* (2006.01)

(52) U.S. Cl.
USPC .............................................. 331/3; 331/94.1

(58) Field of Classification Search
USPC ...................................... 331/3, 94.1
See application file for complete search history.

(56) References Cited

U.S. PATENT DOCUMENTS

| | | | |
|---|---|---|---|
| 4,880,613 A | 11/1989 | Satoh et al. | |
| 6,300,841 B1 | 10/2001 | Atsumi et al. | |
| 7,030,704 B2 | 4/2006 | White | |
| 7,142,066 B1 | 11/2006 | Hannah et al. | |
| 7,468,637 B2 | 12/2008 | Braun et al. | |
| 8,299,858 B2 | 10/2012 | Gan | |
| 2001/0045898 A1 | 11/2001 | Pelekis | |
| 2005/0088248 A1 | 4/2005 | White | |
| 2007/0247241 A1 | 10/2007 | Braun et al. | |

FOREIGN PATENT DOCUMENTS

| | | |
|---|---|---|
| CN | 1827522 A | 9/2006 |
| JP | 2001036405 | 2/2001 |
| JP | 2005522887 | 7/2005 |
| JP | 2007036555 | 2/2007 |
| JP | 2007228225 | 9/2007 |
| JP | 2007336136 | 12/2007 |
| JP | 2010093183 | 4/2010 |

OTHER PUBLICATIONS

M. A. Sturza, "GPS navigation Using Three Satellites and a Precise Clock," in Global Positioning System, vol. 2. Washington, DC: Institute of Navigation, 1984, pp. 122-132.

(Continued)

*Primary Examiner* — Levi Gannon
(74) *Attorney, Agent, or Firm* — Shichrur & Co.

(57) ABSTRACT

Some demonstrative embodiments include devices, systems and/or methods of generating a frequency reference using a solid-state atomic resonator formed by a solid-state material including an optical cavity having color centers. A device may include a solid-state atomic clock to generate a clock frequency signal, the solid-state atomic clock including a solid state atomic resonator formed by a solid-state material including an optical cavity having color centers, which are capable of exhibiting hyperfine transition, wherein the solid-state atomic clock may generate the clock frequency signal based on a hyperfine resonance frequency of the color centers.

29 Claims, 14 Drawing Sheets

(56) References Cited

OTHER PUBLICATIONS

J. Murphy and T. Skidmore, "A low-cost atomic clock: impact on the national airspace and GNSS availability," in Proceedings of ION GPS-94; 7th International Meeting of the Satellite Division of the Institute of Navigation. Salt lake City, UT, 1994, pp. 1329-1336.

H. Fruehauf, "Fast "direct-P(Y)" GPS signal acquisition using a special portable clock," in 33rd Annual Precise Time and Time Interval (PTTI) Meeting. Long Beach, CA, 2001, pp. 359-369.

J. A. Kusters and CA. Adams, "Performance requirements of communication base station time standards," RF design, 28-38 (1999).

A. Brannon, J. Breitbarth, and Z. Popovic, "A Low-Power, Low Phase Noise Local Oscillator for Chip-Scale Atomic Clocks," IEEE Microwave Theory and Techniques Symposium, in press, 2005.

T. P. Mayer Alegre, C. Santori, G. Medeiros-Ribeiro, and R. G. Beausoleil "Polarization-selective excitation of nitrogen vacancy centers in diamond" Physical Review B 76, 165205 (2007).

Charles Santori et al.: "Coherent Population Trapping of Single Spins in Diamond under Optical Excitation" Physical Review Letters, [Online] vol. 97, No. 247401, Dec. 15, 2006, pp. 247401-1-247401-4, XP002534171 Retrieved from the Internet: URL:http://scitation.aip.org/getpdf/servlet/GetPDFServlet?filetype=cvips&prog=normal> [Retrieved on Jun. 24, 2009].

Charles Santori et al: "Coherent population trapping in diamond N-V centers at zero magnetic field" Optics Express, [Online] vol. 14, No. 17 Aug. 21, 2006, XP002533934 Retrieved from the Internet: URL: http://www.opticsinfobase.org/DirectPDFAccess/12743E3E-BDB9-137E-C17D362EF785ADE1_97689.pdf?da=1&id=97689&seq=0&CFID=43920600&CFTOKEN=53189687> [retrieved on Jun. 24, 2009].

KJ. Vahala, "Optical microcavities", Nature Magazine (London) 424, 839 (2003).

S. Haroche and D. Kleppner, "Cavity quantum electrodynamics", Physics Today, Jan. 1989, pp. 24.

Y. Yamamoto and R. Slusher, "Optical processes in microcavities," Physics Today, Jun. 1993, pp. 66, vol. 46, Issue 6.

CJ. Hood, T.W. Lynn, A.C. Doherty, A.S. parkins, and H. J. Kimble, "The atom-cavity; and/or microscope: single atoms bound in orbit by single photons," Science, vol. 287, No. 25, pp. 1447-1453 (2000).

Torsten Gaebel et. al. "Room-temperature coherent coupling of single spins in diamond" Nature Physics 2, 408-413 (2006).

R. Hanson, O. Gywat, and D. D. Awschalom "Room-temperature manipulation and decoherence of a single spin in diamond" Phys. Rev. B 74, 161203(R) (2006).

R. Hanson, F. M. Mendoza, R. J. Epstein, and D. D. Awschalom "Polarization and Readout of Coupled Single Spins in Diamond" Phys. Rev. Lett. 97, 087601 (2006).

N. B. Manson, J. P. Harrison, and M. J. Sellars "Nitrogen-vacancy center in diamond: Model of the electronic structure and associated dynamics" Phys. Rev. B 74, 103303 (2006).

Ph. Tamarat et. al. "The excited state structure of the nitrogen-vacancy center in diamond" arXiv:cond-mat/0610357v1 Oct. 13, 2006.

T. P. Mayer Alegre, A. C. Torrezan, G. Medeiros-Ribeiro "Microstrip resonator for microwaves with controllable polarization" Appl. Phys. Lett. 91, 204103 (2007).

T. P. Mayer Alegre, C. Santori, G. Medeiros-Ribeiro, and R.G. Beausoleil "Polarization-selective excitation of nitrogen vacancy centers in diamond" Phys. Rev. B 76, 165205 (2007).

A.P. Nizovtsev, S.Ya. Kilin, F. Jelezko, I. Popa, A. Gruber, J. Wrachtrup "NV centers in diamond: spin-selective photokinetics, optical ground-state spin alignment and hole burning" Physica B 340-342 (2003).

J.R. Rabeau et. al. "Implantation of labeled single nitrogen vacancy centers in diamond using 15N" Applied Physical Letters 88, 023113 (2006).

International Preliminary Report on Patentability for PCT/IL2009/000131 mailed on Aug. 19, 2010.

J. Vig, "Military applications of high-accuracy frequency standards and clocks," 40, 522-527 (1993).

H. Fruehoff, "Fast "direct-P(Y)" GPS signal acquisition using a special portable clock," in Pro.c 33rd Ann Precise Time and Time Interval (PTTI) Systems and Applications Meeting, Long Beach, CA, Nov. 27-29, 359-369 (2001).

L. Liew, S. Knappe, J. Moreland, H.G. Robinson, L. Hollberg, and J. Kitching, "Microfabricated alkali atom vapor cells," Appl. Phys. Lett. 48, 2694-2696 (2004).

S. Knappe, V. Velichansky, H.G. Robinson, L. Liew, J. Moreland, J. Kitching, and L. Hollberg, "Atomic Vapor Cells for Miniature Frequency References," in Proc. of the 2003 IEEE International Frequency Control Symposium and PDA Exhibition Jointly with the 17th European Frequency and Time Forum, (Institute of Electrical and Electronics Engineers, New York, 2003), 31-32.

E. Arimondo, "Coherent population trapping in laser spectroscopy," in, Progress in Optics XXXV, E. Wolf, eds. (Elsevier, Amsterdam, 1996), pp. 257-354.

M. Stahler, R. Wynands, S. Knappe, J. Kitching, L. Hollberg, A. Taichenachev, V. Yudin, "Coherent population trapping resonances in thermal Rb-85 vapor: D-I versus D-2 line excitation," Opt. Lett. 27, 1472-1474 (2002).

N. Cyr, M. Tetu, and M. Breton, "All-Optical Microwave Frequency Standard—a Proposal," IEEE Transactions on Instrumentation and Measurement, vol. 42, pp. 640-649, 1993.

J. Kitching, S. Knappe, N. Vukicevic, L. Hollberg, R. Wynands, and W. Weidmann, "A microwave frequency reference based on VCSEL-driven dark line resonances in Cs vapor," IEEE Transactions on Instrumentation and easurement, vol. 49, pp. 1313-1317, 2000.

M. Merimaa, T. Lindvall, I. Tittonen, and E. Ikonen, "All-optical atomic clock based on coherent population trapping in Rb-85," Journal of the Optical Society of America B-Optical Physics, vol. 20, pp. 273-279, 2003.

J. Kitching, S. Knappe, and L. Hollberg, "Miniature vapor-cell atomic-frequency references," Applied Physics Letters, vol. 81, pp. 553-555, 2002.

Matan Kahanov et al.: "An atomic clock based on a VCSEL-driven CPT resonance and a small 87Rb vapor cell" Cleo '07. 2007 Conference on Lasers and Electro-Optics May 5-11, 2007 Baltimore, MD, USA, OSA, Piscataway, NJ, USA, May 1, 2007, pp. 1-2, XP031203354 ISBN: 978-1-55752-834-6.

R. Lutwak et al.: "The Chip-Scale Atomic Clock Coherent Population Trapping Vs. Conventional Interrogation" 34th Annual Precise Time and Time Interval (PTTI) Meeting, [Online] Dec. 3, 2002 (Dec. 5, 2002) pp. 539-550, XP 002533933 Retrieved from the Internet: URL:http://www.pttimeeting.org/archivemeetings/2002papers/paper52.pdf> [retrieved on Jun. 24, 2009] p. 539-p. 547, line 3.

International Search Report for PCT/IL2009/000131 mailed on Sep. 16, 2009.

Office action for Chinese application No. 200980112287.4 mailed on Jul. 10, 2012.

Matan Kahanov et al., "An Atomic Clock Based on a VCSEL-Driven CPT Resonance and a Small 87Rb Vapor Cell", 2007 Conference on Lasers and Electro-Optics, Dec. 31, 2007.

The Written Opinion of the International Search for PCT/IL2009/000131 mailed on Aug. 7, 2010.

Non-final Office action dated Mar. 8, 2012 for U.S. Appl. No. 12/866,264; 8 pages.

Office action for Chinese application No. 200980112287.4 mailed on Dec. 20, 2012.

Office Action from Japanese Patent Application No. 2010-545606; mailed on Jul. 9, 2013; 10 pages, including 5 pages of English translation.

Clark T.-C Nguyen, John Kitching, "Towards Chip-Scale Atomic Clocks", Digest of Technical Papers IEEE International Solid-Static Circuits Conference 2005; Feb. 7, 2005; vol. 01 (pp. 84-85); 3 pages.

Office Action from Chinese Patent Application No. 900980112287.4; mailed on Aug. 12, 2013; 18 pages, including 11 pages of English translation.

DEVICE, SYSTEM, AND METHOD OF FREQUENCY GENERATION USING AN ATOMIC RESONATOR

CROSS REFERENCE

This application is a continuation application of U.S. Ser. No. 12/866,264, filed on Aug. 5, 2010, which is a national phase filing of PCT/IL2009/000131, filed on Feb. 5, 2009, which in turn claims the benefit of and priority from U.S. Provisional Patent application No. 61/026,744, filed Feb. 7, 2008, all the applications of which are incorporated in their entirety herein by reference.

FIELD

Some embodiments relate generally to the field of frequency generation, more particularly, to frequency generation using an atomic resonator.

BACKGROUND

Today, high-end frequency standard references have relatively high cost, large size, high power consumption, etc. The fast deployment of devices and/or systems such as, but not limited to, global positioning systems (GPS) and/or portable GPS systems, cellular systems and/or portable cellular phones and/or small size and low cost cellular base stations, fast telecommunications systems and other high-speed communication links, which employ very high modulation frequencies require stable, precise and accurate frequency standard reference which have small size, low cost and low power consumption. More information on these issues can be found in the following references: M. A. Sturza, "GPS navigation Using Three Satellites and a Precise Clock," in Global Positioning System, vol. 2. Washington, D.C.: Institute of Navigation, 1984, pp. 122-132; J. Murphy and T. Skidmore, "A low-cost atomic clock: impact on the national airspace and GNSS availability," in Proceedings of ION GPS-94; 7th International Meeting of the Satellite Division of the Institute of Navigation. Salt lake City, Utah, 1994, pp. 1329-1336; H. Fruehauf, "Fast "direct-P(Y)" GPS signal acquisition using a special portable clock," in 33rd Annual Precise Time and Time Interval (PTTI) Meeting. Long Beach, Calif., 2001, pp. 359-369; and/or J. A. Dusters and C. A. Adams, "Performance requirements of communication base station time standards," RF design, 28-38 (1999), the entire disclosures of which are incorporated herein by reference.

Quartz crystals oscillators, on one hand, are the most commonly used local frequency standard, but in many cases are not sufficiently accurate, have long term frequency drift, large size and high power consumption and relatively high cost, in the case of high performance quartz crystal oscillators, these drawbacks prevent them to be suitable for the above applications.

On the other hand Rubidium (Rb) or Cesium (Cs) gas base atomic clocks are highly accurate and they have high long-term frequency stability. However, the gas-based atomic clocks have large size, high power consumption, and high manufacturing cost.

U.S. Pat. No. 7,142,066 describes an atomic clock including substantially isolated particles that are capable of exhibiting hyperfine transitions. An alignment device of the clock may establish a predominant direction of spin of the particles. The clock may include an excitation device to, at regular intervals of time, cause the particles to undergo the hyperfine transitions by exciting the particles. A detection device of the clock may detect the hyperfine transitions of the particles. U.S. Pat. No. 7,030,704 describes a frequency standard that derives the reference frequency from the hyperfine spectrum of paramagnetic ions in solids.

SUMMARY

Some embodiments include, for example, devices, systems, and methods of frequency-generation using a solid-state atomic resonator.

In some embodiments a device includes, a feedback circuit which provides a signal to control a controlled oscillator according to an input signal provided by a solid state atomic resonator module; a controlled oscillator which generates an output frequency to a frequency multiplier according to an input signal; a frequency multiplier generates an output microwave signal with a frequency related to the frequency of an input signal; a solid-state atomic resonator module having color centers that are capable of exhibit a hyperfine transition, the solid-state atomic resonator module receives a microwave signal from the frequency multiplier and generates an output signal related to the frequency difference between the frequency of the microwave signal and the frequency of the hyperfine resonance frequency of color centers and an output frequency related to the frequency of the microwave signal.

In some embodiments the solid state atomic resonator includes, a light source that illuminates a light at a polarization controller; a polarization controller through which the light pass that illuminates the light at an optical attenuator; an optical attenuator through which the light pass that illuminates the light at an optical filter; an optical filter through which the light pass that illuminates the light at a solid-state atomic resonator; a solid-state atomic resonator through which the light pass that illuminates the light at an optical filter; an optical filter through which the light pass that illuminates the light at a photo-detector which generate an output signal of the atomic resonator module; a optical cavity encircling the atomic resonator; an microwave cavity encircling the atomic resonator; a microwave element which receives an input microwave signal and transmits an output microwave electromagnetic wave upon the solid state atomic resonator; a magnetic shield encircling the atomic resonator.

In some embodiments the color centers are Nitrogen-Vacancy color centers in diamond.

In some embodiments the solid state atomic resonator includes, a diamond crystal embedded by Nitrogen-Vacancy color centers.

In some embodiments the solid state atomic resonator includes, a diamond nano-crystals embedded by Nitrogen-Vacancy color centers.

In some embodiments the optical cavity includes, a set of alternating parallel thin films of different optical refractive index.

In some embodiments the optical cavity includes, a set of different optical refractive index elements positioned in a photonic crystal structure.

In some embodiments the solid state atomic resonator includes, a microwave modulated light source which receives an input microwave signal and generate an output light modulated by the input microwave signal; the modulated light source illuminates a light at a polarization controller; a polarization controller through which the light pass that illuminates the light at an optical attenuator; an optical attenuator through which the light pass that illuminates the light at an optical filter; an optical filter through which the light pass that illuminates the light at a solid-state atomic resonator; a solid-state atomic resonator through which the light pass that illuminates the light at an optical filter; an optical filter through which the light pass that illuminates the light at a photodetector which generates an output signal of the atomic resonator module; a optical cavity encircling the atomic resonator; a magnetic shield encircling the atomic resonator.

In some embodiments the solid state atomic resonator includes, color centers are Nitrogen-Vacancy color centers in diamond.

In some embodiments the solid state atomic resonator includes, a diamond crystal embedded by Nitrogen-Vacancy color centers.

In some embodiments the solid state atomic resonator includes, a diamond nano-crystals embedded by Nitrogen-Vacancy color centers.

In some embodiments the optical cavity includes, a set of alternating parallel thin films of different optical refractive index.

In some embodiments the optical cavity includes, a set of different optical refractive index elements positioned in a photonic crystal structure.

In some embodiments a method for obtaining a frequency reference includes, the acts of generating a microwave signal; comparing the frequency of the microwave signal to that of the resonance frequency of hyperfine splitting of color center in solid material; adjusting the microwave frequency to the color centers resonance frequency; resealing of the microwave frequency to the required frequency and outputting the resealed frequency, whereby the output frequency refers to that of the color center resonance frequency.

In some embodiments a system substantially includes, an input and output unit; a central processing unit; a memory unit; electronic circuitry; a clock acquisition algorithm; a solid state atomic clock including: resonance coupling device of a microwave frequency signal to color centers resonance, Nitrogen-Vacancy color centers atomic resonator, frequency resealing electronic circuitry.

In some embodiments the device is integrated on a single semiconductor substrate.

In some embodiments a system of a frequency wherein the whole system is integrated on a single semiconductor substrate.

Some embodiments may provide other and/or additional benefits and/or advantages.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
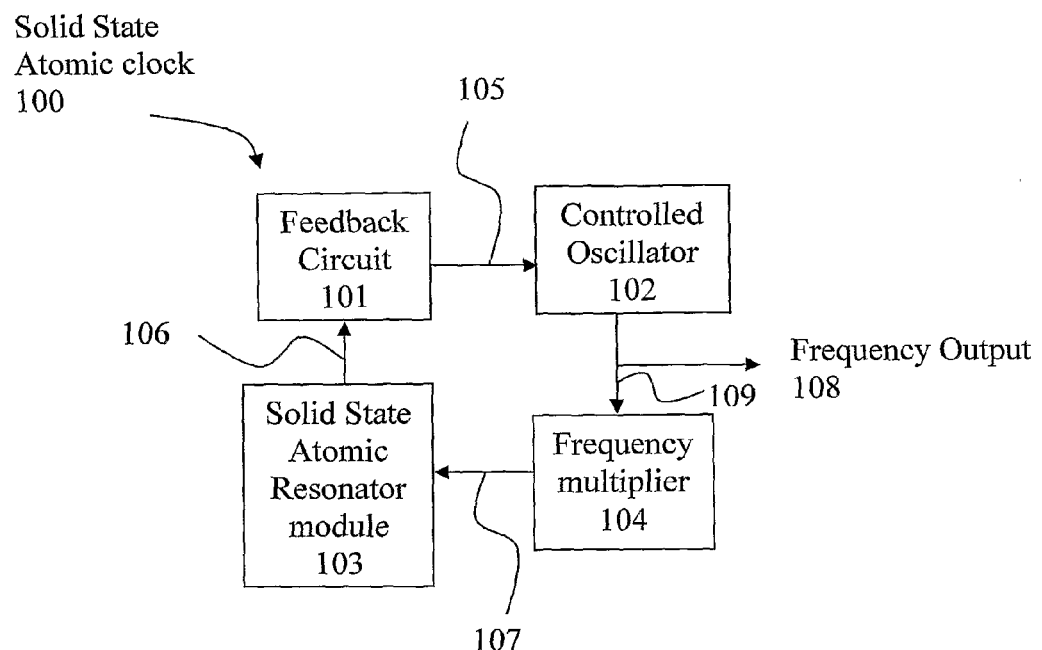
FIG. 1 schematically illustrates a solid-state atomic clock (SSAT) in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Unless specifically stated otherwise, as apparent from the following discussions, it is appreciated that throughout the specification discussions utilizing terms such as "processing," "computing," "calculating," "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like.

It should be understood that some embodiments may be used in a variety of applications. Although embodiments of the invention are not limited in this respect, one or more of the methods, devices and/or systems disclosed herein may be used in many applications, e.g., civil applications, military applications or any other suitable application.

A frequency standard requires a physical frequency resonance as a frequency reference. This resonance should has long term frequency stability, low cost, small size and low power consumption. The most common resonance used in frequency are mechanical resonance of pure atomic crystals (for example quartz crystals) and/or by transitions between quantum states in atoms, ions and molecules (for example in Rb and Cs). In most of such transitions correspond to optical frequencies, which makes the transition difficult to couple to an electrical signal or in other cases the frequency difference is too low to allow a high frequency accuracy.

In general, frequency sources are divided into two categories: crystal oscillators and atomic clocks.

Crystal oscillators are based on a mechanical resonance of a quartz crystal. Such oscillators have very poor temperature stability. Crystal oscillators vary from free running oscillators with very low frequency stability and accuracy to oven temperature controlled crystal (OCXO) oscillator with rather good short-term frequency accuracy and stability (still less than that of an atomic clocks). However, even though OCXO have good short term frequency stability their long-term frequency stability is poor (over long periods of time—days, weeks or months—their frequency will drift). Moreover, they have high power consumption and/or a large size. Another drawback of the crystal oscillators is the low manufacturing yield of the resonator. Usually, the resonator is a precise cut of a quartz crystal the crystal cutting should be very accurate and along a special direction of the quartz crystal. The complexity of this process is very high and any deviation will result in an error in the resonance frequency. Therefore, the yield is low for such oscillators and as a result the manufacturing cost is high. Furthermore, crystal oscillator cannot be fully integrated on a silicon substrate and/or a electronic integrated circuits.

Gas-based atomic clocks are based on the atomic energy transition in Rb or Cs atoms in gas phase. These types of atomic clocks use atomic energy levels to generate a long-term stable and highly accurate frequency output. Typically, gas based atomic clocks use the hyperfine energy level splitting of Rb or Cs atoms in a gas state as the frequency resonance. The traditional atomic clocks are expensive, large and require high power consumption. These characteristics prevent atomic clocks from becoming a commodity. Even though small size atomic clocks can be realized, they still suffer from the drawbacks described here, this technology is immature up to date.

A gas-based atomic clock includes an atomic resonator, which includes a cell filled with a vapor of Rubidium-87 or Cesium-133 atoms. These atoms have very accurate and stable hyperfine ground state energy splitting. Therefore, an accurate and stable frequency signal may be generated by coupling an external electromagnetic field to this energy level splitting. This type of gas-based atomic clocks may have very high long-term frequency accuracy, may be very reliable, and for more than sixty years have been the most accurate commercial atomic clocks available. However, the gas-based atomic clocks suffer from the following drawbacks: high power consumption; high cost; large size; relatively high sensitivity to G-shock; long warm up time; the cell should be heated to a constant working temperature, and it is very complex to assemble and to manufacture. Furthermore, crystal oscillator cannot be fully integrated on a silicon substrate and/or a electronic integrated circuits. These drawbacks prevent the gas-based atomic clocks from becoming small and to be integrated into portable and low cost applications.

Some atomic resonators the double resonance technique by applying an electromagnetic optic and microwave RF fields may be implemented for the control of the hyperfine transition, e.g., as described below.

Figure 2A:
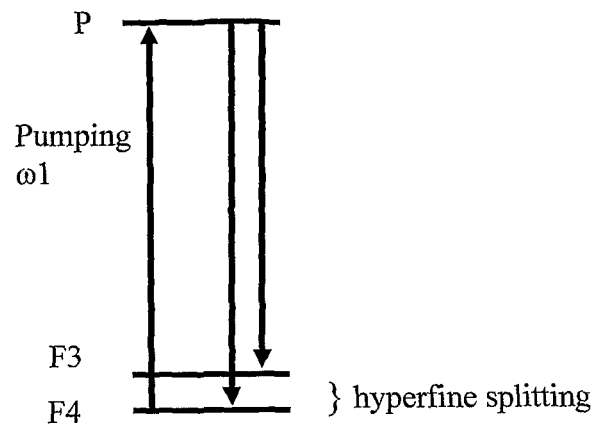
FIGS. 2a and 2b are schematic energy level diagrams of hyperfine splitting, in accordance with some embodiments.
Figure 2B:
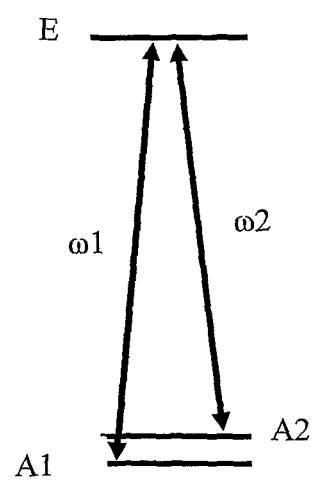

Rubidium or Cesium with hyperfine ground energy level splitting F4 is presented in FIG. 2*a*. and FIG. 2*b*. Optical pumping, with a frequency ω1 corresponding to the transition from the ground energy level F4 to the exited energy level P, may be used to excite only the electrons from the F4 energy state in Rb/Cs atom gas to the exited state P. The exited electrons in the exited energy level P are relaxed to both the F4 and F3 states evenly. However, only electrons from the energy level F4 state are excited again due to the optical pumping. Therefore, in steady state the F3 state becomes over populated at this point the absorption of the pumping photons reach a steady state as well. Applying a microwave RF electromagnetic wave with a frequency equal to the frequency difference between the F4 to F3 states, may convert the F3 electron state to the F4 state, which provides more electrons to absorb light. Therefore, the electromagnetic wave with this particular microwave frequency results in an increase of light absorption, e.g., a dip in the absorption is presented in the absorption of the pumping light at the microwave frequency equals to the hyperfine transition. This dip in the microwave spectrum may be detected by a photodetector. A servo feedback locks the frequency of the microwave electromagnetic wave thereby to control the oscillator frequency according to the atomic transition. Usually, in this configuration the gas cell is placed in a microwave cavity and illuminated from one of the sides of the cavity.

As shown in FIG. 2*b*, in some atomic resonators a coherent population trapping (CPT) technique is used. In this cases a microwave modulated electromagnetic optic field, which has of two and/or more than two sidebands may be implemented for the control of the hyperfine transition, e.g., as described below.

Figure 3A:
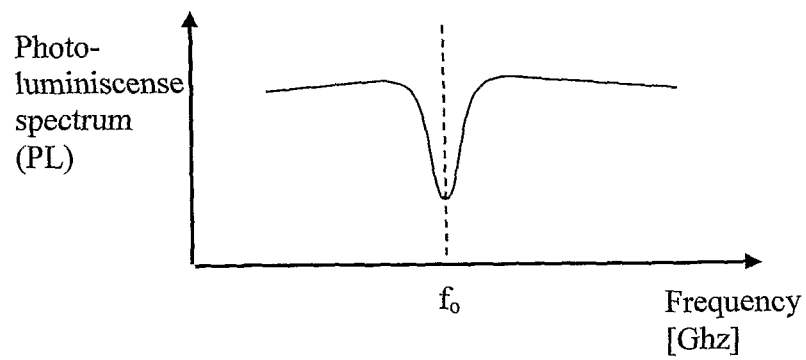
FIGS. 3a, 3b and 3c are schematically illustrates graphs depicting intensity versus frequency spectrum of hyperfine splitting, In accordance with some embodiments.
Figure 3B:
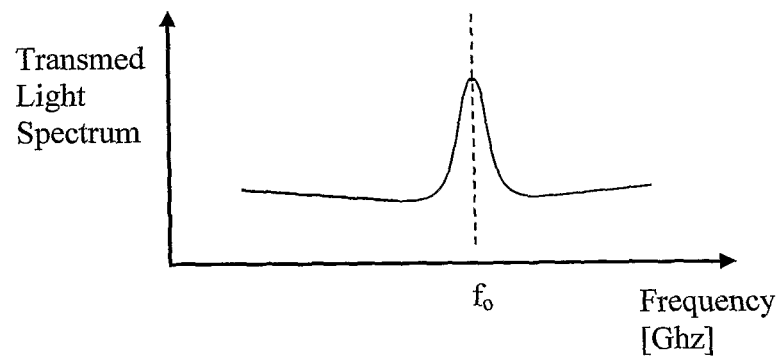
Figure 3C:
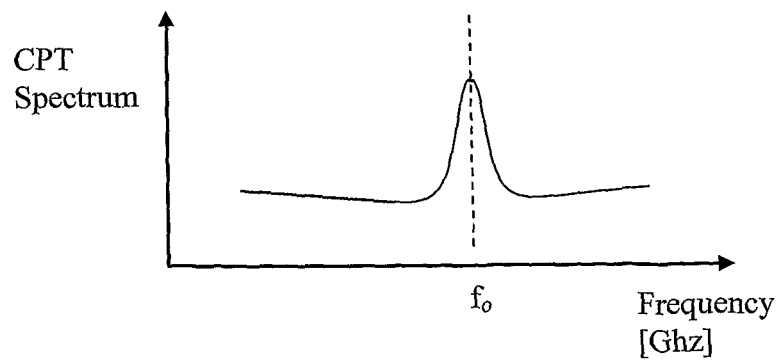

As shown in FIG. 2*b*, CPT resonance may induced by two coherent optical electromagnetic fields with a frequencies ω1 and ω2 corresponding to the energy transition from A1 to E and from A2 to E in atomic system, respectively, e.g., by a light source. The frequency difference between the frequencies of the two electromagnetic fields ω1 and ω2 separating the two coherent optical fields is equal to the energy difference between the two low energy levels A1 and A2 divided by the Plank constant h. This optical field is applied to an atomic resonance. The atomic resonator which has at least one low energy state with a small energy split between the two levels and at least one high energy state that electrons can be excited to, from the two hyperfine spited low energy states A1 and A2. The first frequency component ω1 in the applied electromagnetic field excites electrons from one of the low energy states A1 to the high energy state E while the other frequency component excites electrons from the other low energy state A2 to the same high energy state E. Thus, the atomic resonator absorbs the energy from the two components of the applied electromagnetic field simultaneously. When the frequency difference between the two frequency components is equal to the frequency difference between the two low energy states in the atomic resonator, the atomic resonator can be in a linear superposition of the two low energy states, such that at this quantum state the atomic resonator does not interact with the applied electromagnetic field any more. This quantum state and the resulting behavior is called CPT. In this state the atomic resonator exhibits an absorption minimum, or a transmission maximum, or a minimum of luminescence see FIG. 3a 3b and/or 3c correspondingly. Therefore, a, for example, when the frequency difference between the two frequencies components is exactly equal to the frequency difference between two low energy states in the atomic resonator. A photo detector may be used to measure the intensity of one of the above quantities. A photo-detector measures signal quantity which is corresponding to the error between the two frequencies ω1 ω2 to the frequency difference in the hyperfine energy splitting, this error signal is feedback to a servo loop, which may be used to adjust the frequency difference of the two frequency components produced by the light source, such that the error between the two frequencies ω1 ω2 to the frequency difference in the hyper fine energy splitting is kept to that the maximum/minimum, e.g., as shown in FIG. 3a 3b and/or 3c. Hence, the frequency difference of the two frequency components may be held at a precise value corresponding to the frequency difference in energy split in the low energy states of the atomic resonator. The frequency standard precision and stability may correspond to the precision and stability of the difference between the split in the energy of the low states in the atomic resonator.

FIG. 1 a schematically illustrates a SSAC in accordance with some demonstrative embodiments. In some non-limiting embodiments the SSAC 100 of FIG. 1 may perform the functionality of the SSAC of one or more of FIGS. 9-14.

The method for obtaining a frequency reference is implemented by generating a microwave signal 413 by controlled oscillator 411 with a frequency corresponding to the resonance of quantum state 416, the frequency of the microwave signal is compared 418 to that the resonance frequency 416 of hyperfine splitting of color center in solid state medium, the output signal 410 of the comparator 418 is used to adjust the microwave frequency to that of the color centers resonance frequency 416 and resealing 414 of the microwave frequency to the required frequency and outputting the resealed frequency 415, whereby the output frequency refers to that of the color center resonance frequency. As shown in FIG. 8b The SSAC may include a controlled oscillator 102, a frequency multiplier 104, a solid-state atomic resonator, and/or a feedback circuit 101, e.g., as are described in detail below.

The controlled oscillator 102 is a frequency oscillating generator which is able to change its output frequency according to a provided controlled signal as an input. The frequency output of the controlled oscillator 102 may be multiplied, coupled and locked to the frequency resonance or energy resonance of the solid-state resonator. Therefore, a highly precise and stable frequency output may be obtained.

The frequency multiplier 104 is an electronic device or circuit which is capable of getting an input signal with a low frequency and generates an output signal with higher a frequency. The value of the output frequency equals to the value of the input frequency multiplied by a numerical factor sets to the frequency multiplier 104. A The frequency multiplier 104 in FIG. 1 gets a relatively low frequency from the controlled oscillator 102 as an input and generates a signal with frequency corresponding to the resonator resonance frequency as an output. This frequency may be fed and/or coupled to the resonator module, e.g., via optical and/or microwave signals transmitter. The resonator module uses an atomic resonance to be used as a frequency reference. It may receive as an input the output of the frequency multiplier 104, and generate an output error signal proportional to the difference between the internal resonance frequency of the resonator atomic resonance and the multiplier output frequency 107.

The feedback circuit 101 may receive an output error signal 106 of the solid-state resonator module 103 as an input and generates an error correction signal 105 to the controlled oscillator 102. The controlled oscillator 102 uses this error signal to correct its output frequency 108 109, e.g., in order to reduce the error between the output frequency 107 of the frequency multiplier 104 and the solid-state resonator 219 resonance frequency. Accordingly, the output frequency 108 may be locked to the atomic resonance frequency of the solid-state atomic resonator 219.

Feedback Circuit 101:

The feedback circuit 101 may receive the resonator output error signal as an input and convert it into a correction signal to be provided to the controlled oscillator 102 module. The output signal of the atomic resonator module 106 may have an extremum in the output signal level, e.g., exactly at the frequency value where the input frequency and the internal resonance frequency of the atomic resonator 219 are equal. The atomic resonator module output error signal 106 is proportional to the difference between the frequency of the applied microwave signal 107 to the internal resonance frequency of the atomic resonator 219. The error signal at the output of the atomic resonator 106 is provided to the input of the feedback circuit 101 may have a low signal to noise ratio. Therefore, a filtering and/or signal-processing scheme may be used in order to extract the error signal from the noise. For example, a synchronous detection scheme can be used in the feedback circuit 101 to detect very low signals in noise and to estimate the correct error signal. Since the SSAC may operate as a closed loop, a control system may be implemented, e.g., as part of the feedback circuit 101 and/or as part of any other element of the SSAC, to achieve maximum stability, minimum output frequency noise and/or Allan deviation. In one non limiting example, a PID control scheme can be implemented. In one non limiting example, a synchronous filter may be implemented for one non limiting example an Analog Device inc. AD630, AD633 balance modulator/demodulator. The PID scheme can be implemented with an operational amplifier (e.g., Analog Devices Inc. part number ADTL082) and passive electronic components.

Controlled Oscillator 102:

The controlled oscillator 102 may include a frequency oscillator. The controlled oscillator 102 may receive an input signal from the feedback circuit 101 and convert it into a frequency output signal, which is corresponding to the signal level of the input signal. The controlled oscillator 102 may be implemented, for example, by a high Q factor voltage controlled oscillator 102, In one non limiting example, a Voltage Controlled Crystal Oscillator (VCXO), which may include a low frequency oscillator based on a quartz crystal. The crystal oscillations may have very high Q factor and good short-term stability. However, it may have very poor long-term stability expressed in frequency drifting as the time elapse. These kinds of oscillators have an input controlled voltage, which allows change in the output frequency according to the input voltage level. The output frequency of the VCXO may be corrected according to the output signal generated by the feedback circuit 101. In one non-limiting example, the VCXO may include a Vectron International V-800 VCXO, or equivalents, e.g., as described by A. Brannon, J. Breitbarth, and Z. Popovic, "A Low-Power, Low Phase Noise Local Oscillator for Chip-Scale Atomic Clocks," IEEE Microwave Theory and Techniques Symposium, in press, 2005, the entire disclosure of which is incorporated herein by reference.

Frequency Multiplier 104:

The frequency multiplier 104 may receive a frequency input from the VCXO and multiply the frequency input to result in an output frequency equals to the value of the input frequency multiplied by a required factor. The output frequency may be substantially equal to the resonator frequency resonance, e.g., in the case of the electromagnetic microwave method described herein; or substantially half of this frequency, e.g., in the case of the CPT method described herein. In one non limiting example, the frequency multiplier 104 may use a PLL (Phase Lock Loop), FLL (Frequency Lock Look), frequency mixing and/or any other technique. These methods of frequency multiplication allow a frequency altering while keeping the phase noise low. In one non limiting example, the frequency multiplier 104 can be implementing, for example, by a DDS (Direct Digital Syntisizer), e.g., if advance frequency processing is required. The frequency multiplier 104 may be implemented, in one non-limiting example, using Analog Device inc. RF PLL Frequency Synthesizers such as AD809, ADF4212, ADF4213, ADF4218L, ADF4007 or equivalent.

Atomic Resonator Module 103:

The atomic resonator module 103 may receive as an input a microwave frequency of an electro-magnetic signal as an input 107 from the frequency multiplier, which may be intended to be substantially equal to the internal frequency resonance of the resonator (In the case of CPT, a signal with half of this frequency is required as described herein). The atomic resonator may generate an output error signal 225 substantially equal to the difference between the input frequency 107 and an internal resonance frequency of the atomic resonator, e.g., as described below.

In some embodiments, the solid state atomic resonator module 103 may be implemented by as a double resonance resonator 199 which includes one or more of the following elements and/or modules, e.g., as described below:

An excitation light source 200.
Light source power controller 201.
Light source wavelength controller 202.
An Optical processing elements include an optical polarization controller 204, an optical attenuator 205 and/or and optical wavelength filter 206.
A microwave amplifier 222.
A microwave polarizer 221.
A microwave transmitting antenna to transmit the microwave electromagnetic radiation upon the quantum resonat 220.
An optical cavity 209.
An atomic resonator element including a solid-state material 220 having an energy level system which may have hyperfine energy splitting, e.g., as described herein.
Light Polarizer 207.
Optical filter 224.
Photo-detector 226.
Magnetic field shielding 207.

In some embodiments, the solid state atomic resonator module 103 may be implemented by as a CPT resonator 299 which includes one or more of the following elements and/or modules, e.g., as described below:

An excitation light source 300.
Light source power controller 301.
Light source wavelength controller 302.
An Optical processing elements include an optical polarizer 306, an optical attenuator 307 and/or and optical wavelength filter 308.
A Microwave modulator, which can modulate the light source directly 303;
An optical cavity 311.
An atomic resonator 312 element including a solid-state material having an energy level system which may have hyperfine energy splitting, e.g., as described herein.
Light Polarizer 316.
Optical filter 314.
Photo-detector 315.
Magnetic field shielding 310.
The Solid State Resonator 219 312

In some embodiments, the solid-state resonator may include a solid-state material including color centers in an optical cavity, e.g., as described herein. The color centers may be vacancies, e.g., a site where one atom is missing in the material matrix, or a vacancy with relation to one or more atom elements different from the solid-state material matrix. The solid-state material matrix can be single crystal, polycrystalline, nanocrystalline, amorphous or any other form. The color centers can be electrically neutral or charged. The atomic resonator may include a single color center or an ensemble of a large number of color centers. The color centers can be randomly scattered or ordered in the solid-state material matrix.

Figure 6:
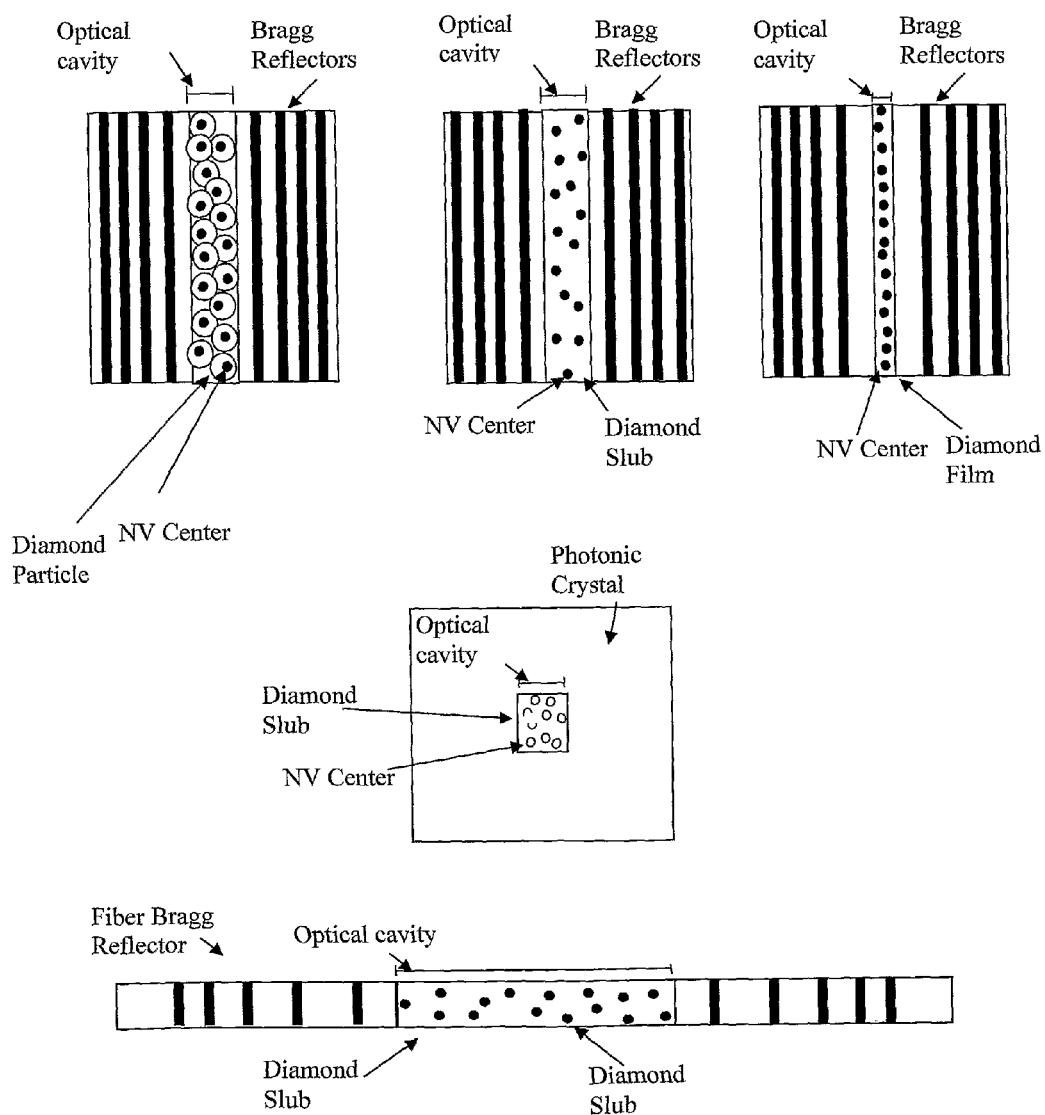
FIG. 6 schematically illustrates optical cavities embedded with NV centers in accordance with some demonstrative embodiments.

The solid-state material may be placed in an optical cavity as described below and/or as shown in FIG. 6. The color centers may have hyperfine energy splitting in the ground energy state and may have one or more higher energy levels. Electrons from the ground states can be exited to one of these higher energy levels. The hyperfine resonance splitting can be read out by optical detected microwave radiation excitation or by optical detected CPT, e.g., as described herein. Electrons in the ground state can be exited by a coherent and/or non-coherent light source or by any other electro magnetic radiation. The photon energy or wavelength of the exiting radiation can be in the IR range, the visible range, or any other suitable photon energy.

Figure 4:
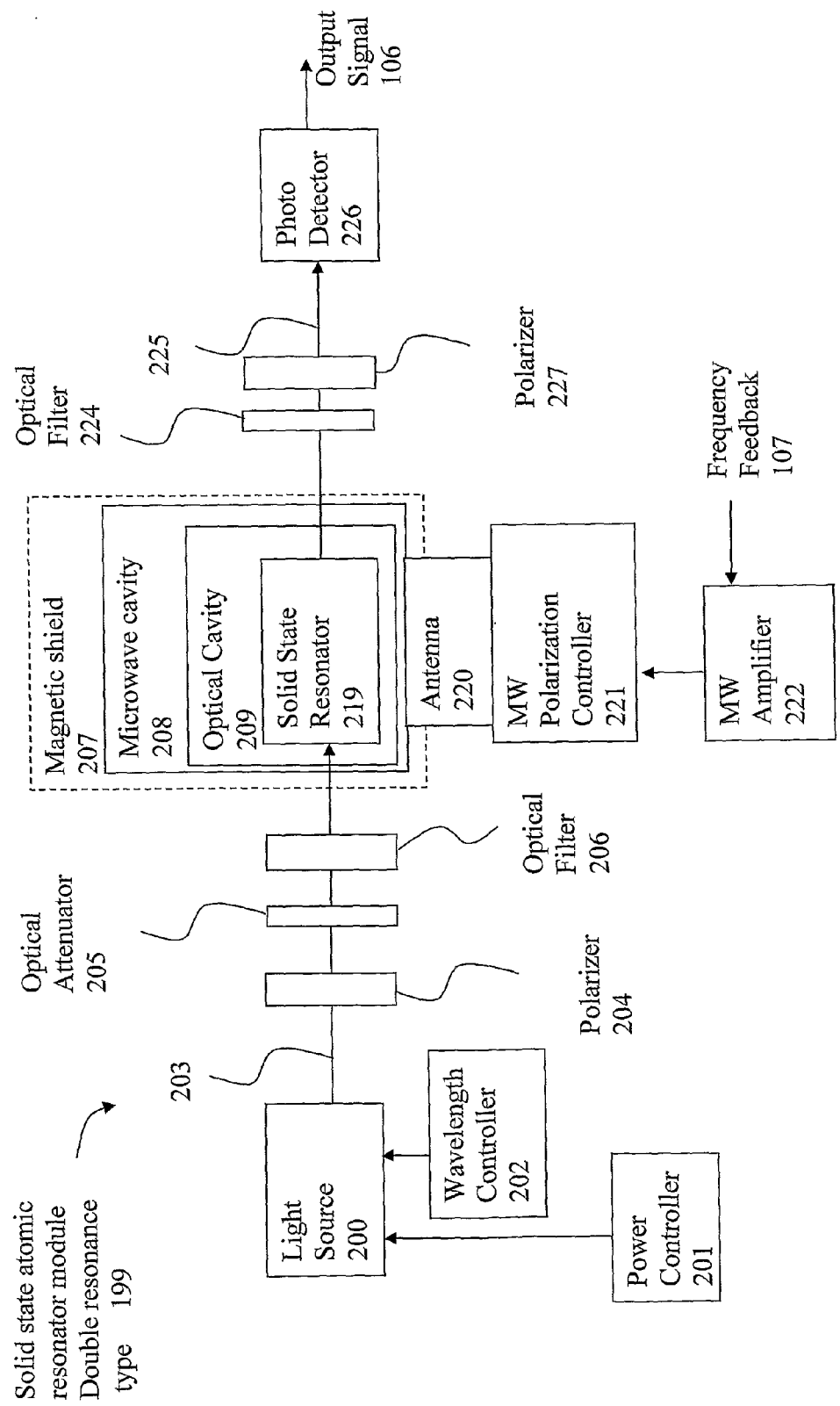
FIG. 4 schematically illustrates a solid-state atomic resonator module in accordance with one demonstrative embodiment.

FIG. 4 schematically illustrates a double resonance based solid-stat atomic resonator module 199 in accordance with one demonstrative embodiment. In some non-limiting embodiments the solid-state atomic resonator of FIG. 4 may perform the functionality of the SSAC of FIG. 1

The solid-state atomic resonator module 199 of FIG. 4 may implement any suitable method for measurement of the resonance lines by a double resonance technique. In one non limiting example, the solid-state atomic resonator module 199 of FIG. 4 may implement a method for acquire the resonance lines of a hyperfine energy splitting in color center by a double resonance technique and to couple a microwave frequency 107 of a free running oscillator 102 and frequency multiplier 104 to an atomic resonance in atomic resonator 103 219. As describe by the technique as described, for example, by T. P. Mayer Alegre, C. Santori, G. Medeiros-Ribeiro, and R. G. Beausoleil "Polarization-selective excitation of nitrogen vacancy centers in diamond" Physical Review B 76, 165205 (2007), the entire disclosure of which is hereby incorporated herein by reference.

A light source 200 302 with a wavelength controller 202 300 and power controller 201 301 may be implemented to illuminate a solid-state resonator 219 312, e.g., as described herein, through a linear polarizer 204 306, an optical attenuator 206 307 and an optical filter 206 308. The wavelength of the illuminating light 203 305 can be but not limited to the Zero Phonon Line (ZPL) at 637 nm or at 532 nm, which can excite an electron in the ground energy level $^3A$ of a Nitrogen Vacancy (NV) center in diamond to the excited energy level $^3E$, e.g., as described below.

In non limiting example, pumping by illuminating the NV centers in a diamond by a light source 200, either by 637 nm photons or by 532 nm photons with are polarized, from the ground energy level $^3A$ to one of the sublevels of the excited energy level $^3E$ e.g., as described below, results photo-luminescent due to the relaxing of electron to the ground state. The probability of relaxing to the ms=0 spin state of the $^3A$ ground energy is much higher as a result electrons are accumulate of at the ms=0 spin state of the $^3A$ ground energy state at steady state. As a result the photo luminescence of the NV centers is constant at a steady state. Microwave excitation with a frequency equals to that of the hyperfine splitting results in the transfer of electrons from the ms=0 spin state of the ground state to the ms=±1 spine state of the ground state, which may reach a extrimum, both of the photo-luminescent and of the transmission of the light pass through, as the excitation frequency is equal exactly to the ground state energy splitting as describe in FIGS. 3a and 3b. This extrimum is use to detect the microwave resonance by the photo detector 226 and to provide an output signal 106 related to the error between the resonance frequency and the microwave.

Figure 5:
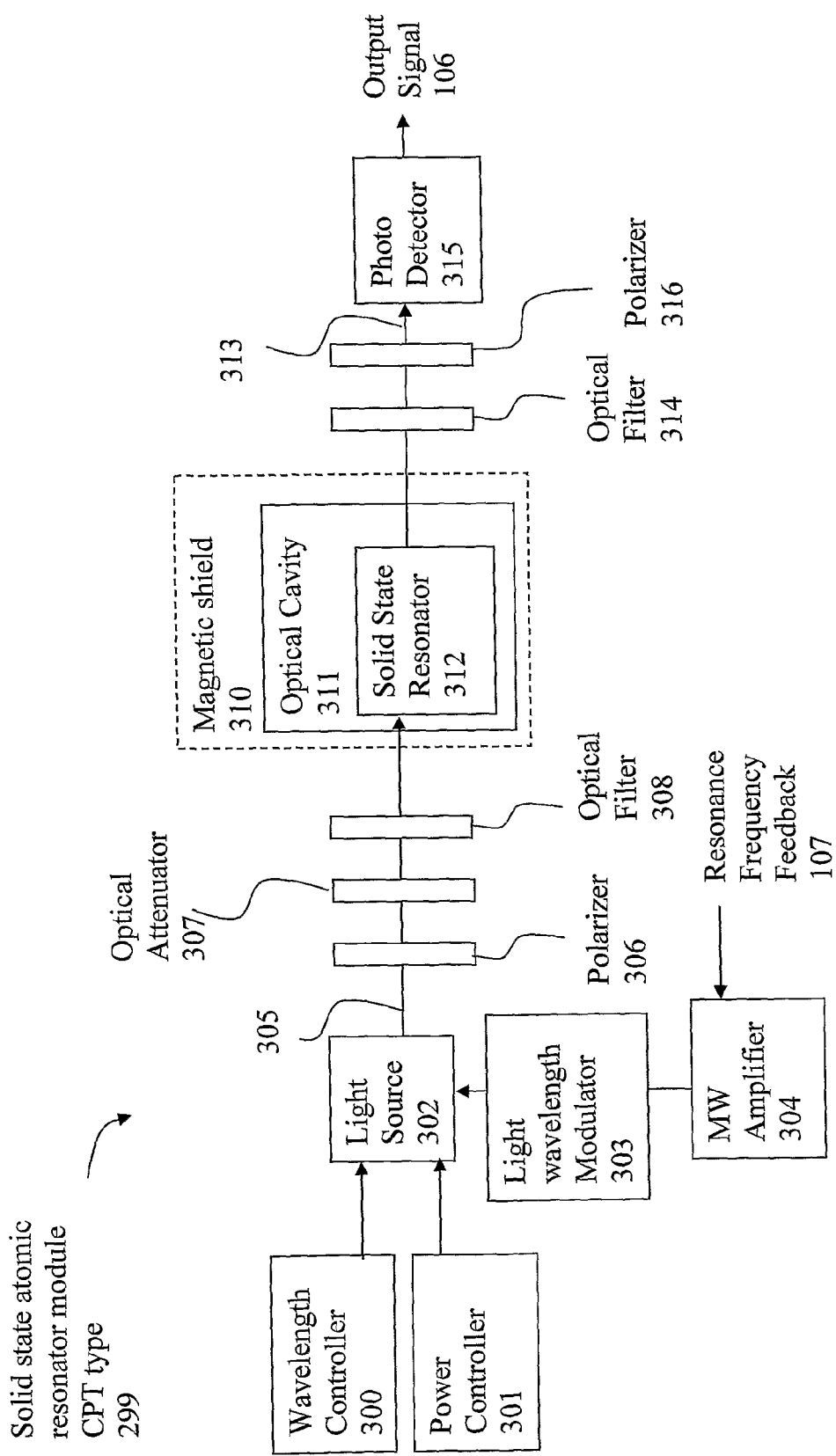
FIG. 5 schematically illustrates a solid-state atomic resonator module in accordance with another demonstrative embodiment.

FIG. 5 schematically illustrates a CPT based solid-state atomic resonator module 299 in accordance with another demonstrative embodiment. In some non-limiting embodiments the solid-state atomic resonator of FIG. 5 may perform the functionality of the SSAC of FIG. 1.

The solid-state atomic resonator module 299 of FIG. 5 may implement any suitable method for measurement of the resonance lines by a CPT technique. In one non-limiting example, the solid-state atomic resonator module 103 of FIG. 5 may implement a method for measurement of the resonance lines by a CPT technique as described but limited to by Charles Santori et. al. "Coherent Population Trapping of Single Spins in Diamond under Optical Excitation" Phys. Rev. Lett. 97, 247401 (2006), and/or Charles Santori et. al. "Coherent Population trapping in diamond N-V centers at zero magnetic field" Vol. 14 No. 17 Opt. Exp. (2006), the entire disclosures of which are incorporated herein by reference.

A light source 302 with two coherent wavelengths may illuminate a solid-state resonator 312 through a linear polarizer 306, an optical attenuator 307, and an optical filter 308 e.g., as described herein. The wavelengths and power may be controlled such that the frequency difference between the two coherent wavelengths is tuned to be equal to the ground state splitting of 2.88 Ghz. This frequency difference in the light source wavelength is produced and controlled by an external microwave signal, which may be used as the frequency reference in the SSAC. The wavelengths of the illuminating light can be but not limited to the ZPL at 637 nm or at 532 nm or any other wavelength, which can excite the NV center from the ground energy level $^3A$ to one of the sublevels of the excited energy level $^3E$ e.g., as described below. In a non limiting example, illuminating the NV centers in the diamond may result in excitation of electrons from the ms=0 and ms=±1 ground sublevel energy states to the excited state $^3E$ simultaneously. This simultaneous excitation will results in a CPT quantum state and, as a result, a dip in the photo luminescence or a peak in the transmission of the NV centers as function of the transmitted frequency value exists. This extremum occurs when the frequency of the microwave signal from the frequency multiplier 104 is exactly equal to half of that of the ground state energy splitting. Hence, the controlling microwave frequency may be locked to the hyperfine resonance.

The Optical Cavity 209 311

In some non-limiting examples, The optical cavity 209 311 may include an optical cavity 209 311 as described, for example, by K. J. Vahala, "Optical microcavities", Nature (London) 424, 839 (2003); S. Haroche and D. Kleppner, "Cavity quantum electrodynamics", Physics Today, January 1989, pp. 24; Y. Yamamoto and R. Slusher, "Optical processes in microcavities," Physics Today, June 1993, pp. 66; C. J. Hood, T. W. Lynn, A. C. Doherty, A. S. parkins, and H. J. Kimble, "The atom-cavity; and/or microscope: single atoms bound in orbit by single photons," Science, vol. 287, No. 25, pp. 1447-1453 (2000), the entire disclosures of which are hereby incorporated herein by reference.

The optical cavity 209 311 may include a "narrow wavelength" multiple reflection cavity. Inside the cavity only photons with a wavelength matching the boundary conditions and the allowed optical mode are sustained. High intensity optical modes are generated inside the cavity. These modes interact continuously with the color center of the solid-state resonator 219 312, to result in higher quantum efficiency and narrower absorption and emission lines. In one non limiting example, the optical cavity 209 311 may be implemented, for example, as part of the diamond material described above. In another non limiting example, the optical cavity 209 311 may be implemented separately, and the color centers may be incorporated to the cavity.

The NV centers may include micrometer diamond particles or nano diamond particles containing NV centers, or may be implemented as part of a solid slab of diamond. The optical cavity may be implemented using Fabry Perot, Bragg mirrors or Bragg Reflectors, photonic crystal resonator, external cavity, Fiber Bragg grating, membrane cavity, vertical cavity, micro-pillar vertical cavity, micro discs, Whispering gallery or any other optical cavity implementations, e.g., as shown in FIG. 6.

The optical cavity 209 311 can be but not limited to one wavelength narrow band or dual band narrow wavelength, wherein one band can be tuned to the excitation wavelength and the other band can be tuned to the emission or luminescence wavelength. The optical cavity 209 311 may improve the emission/luminescence gain it improves the interaction of the incident light beam with the color centers. The optical cavity 209 311 may narrow the absorption band and the emission band, and may eliminate shifting and broadening of the zero phonon lined due to stress and/or other parameters.

Example of a NV Color Center in DIAMOND:

A specific description of NV color centers in diamond can be found, for example, in Torsten Gaebel et. al. "Room-temperature coherent coupling of single spins in diamond" Nature Physics 2, 408-413 (2006); R. Hanson, O. Gywat, and D. D. Awschalom "Room-temperature manipulation and decoherence of a single spin in diamond" Phys. Rev. B 74, 161203(R) (2006); R. Hanson, F. M. Mendoza, R. J. Epstein, and D. D. Awschalom "Polarization and Readout of Coupled Single Spins in Diamond" Phys. Rev. Lett. 97, 087601 (2006); N. B. Manson, J. P. Harrison, and M. J. Sellars "Nitrogen-vacancy center in diamond: Model of the electronic structure and associated dynamics" Phys. Rev. B 74, 103303 (2006); Ph. Tamarat et. al. "The excited state structure of the nitrogen-vacancy center in diamond" arXiv:cond-mat/0610357v1 13 Oct. 2006; T. P. Mayer Alegre, A. C. Torrezan, G. Medeiros-Ribeiro "Microstrip resonator for microwaves with controllable polarization" Appl. Phys. Lett. 91, 204103 (2007); T. P. Mayer Alegre, C. Santori, G. Medeiros-Ribeiro, and R. G. Beausoleil "Polarization-selective excitation of nitrogen vacancy centers in diamond" Phys. Rev. B 76, 165205 (2007); A. P. Nizovtsev, S. Ya. Kilin, F. Jelezko, I. Popa, A. Gruber, J. Wrachtrup "NV centers in diamond: spin-selective photokinetics, optical ground-state spin alignment and hole burning" Physica B 340-342 (2003); and/or J. R. Rabeau et. al. "Implantation of labeled single nitrogen vacancy centers in diamond using $^{15}N$" Applied Physical Letters 88, 023113 (2006), the entire disclosure of which are incorporated herein by reference.

Figure 7A:
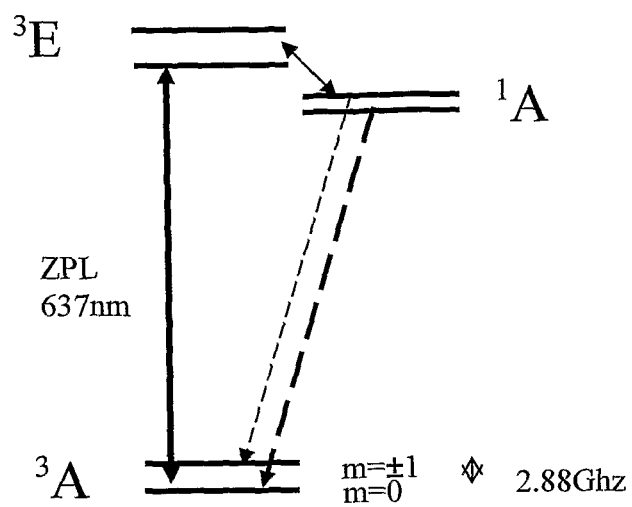
FIG. 7a schematically illustrates an energy diagram of an NV color center in accordance with some demonstrative embodiments.
Figure 7B:
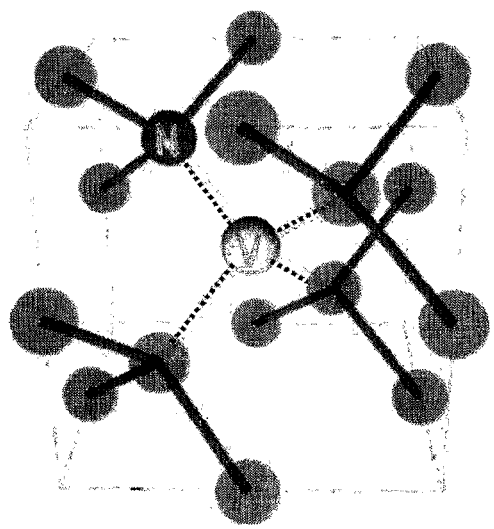
FIG. 7b schematically illustrates an NV center structure in diamond in accordance with some demonstrative embodiments.

A NV center in diamond may include a vacancy, e.g., absence of carbon atom, with a one Nitrogen substitute atom in one of the six atomic sites around the vacancy as shown at FIG. 7b. It can be either Nitrogen or Nitrogen isotope as a substitute atom in the center. In its negative charge-state (NV−) this color center has very high photo stability and room temperature stability. It has a spin triplet (S=1) ground state $^3A$ and spin triplet (S=1) Exited state $^3E$. The ground state has a very stable hyperfine zero field splitting of 2.88 Ghz between the sublevels a spin singlet Sz (ms=0) and the spin doublet Sx Sy (ms=±1), and a metastable $^1A$ energy state. The $^3A$ to $^3E$ ZPL transition is a spin conserving and has a very strong optical transition and high quantum efficiency as shown at FIG. 7a. Electrons may accumulate at the ms=0 state of the ground energy level by linear polarized optical excitation between the $^3A$ to $^3E$ energy states that relaxed to the ground ms=0 sublevel by submitting a photo-luminescent photon. The photoemission transition of the color center from the exited state $^3E$ to the ms=0 spin state $^3A$ ground energy state is much stronger then the emission due to the transition to the ms=±1 spin state of the $^3A$ ground energy state due to additional metastable energy level $^1A$, which has strong non radiative energy transition to the ms=0 spin state $^3A$ ground energy state. These two properties of the color center may allow, for example, to resolve optically the hyperfine structure of the ground state, e.g., by applying microwave excitation with a frequency equal substantially exactly to the hyperfine energy splitting frequency. This microwave radiation may excite the pumped electrons from the ms=0 level to the ms=1 level, thereby resulting in decreasing of the photoluminescence intensity.

The ZPL optical transition between the $^3A$ ground state and the $^3E$ exited state in the color center has very high quantum efficiency, which allows the luminescence detection of even a single optical center. The $^3A$ energy ground level is split due to the hyperfine energy splitting between the two ground energy levels. The lower level has spin splitting is 2.88Ghz. The energy resonance can be read by optical-microwave resonance or by CPT, e.g., as explained above. Diamond has a low phonon density, and therefore the interaction between the color center and the phonons in the diamond is low. The ground sate has long decoherence time of the electron spin state. Very sharp resonance line, relative to resonance lines of color centers in other materials, can be detected even at room temperature. The NV color center has wide absorption band from the ZPL at 637 nm and to less than 450 nm the emission band of the NV center is from the ZPL at 637 nm to a vibronic emission band between 637 nm to 750 nm, which can be easily detected by a silicon photo detector. This absorption and emission resonance line and the adsorption and the emission lines band can be used to excite and measure the photo luminescence of the color center. Diamond is a highly stable material and a wide band-gap semiconductor material with a wide transparency window in the visible spectrum. It is a very good heat conductor and can be very good insulator or good conductor, e.g., upon doping.

FIG. 7a schematically illustrates an energy level diagram of an NV color center.

FIG. 7b schematically illustrates a NV center structure in diamond lattice. The gray spheres represent the carbon atoms in the diamond lattice, the "N" sphere represent the nitrogen atom and the "V" sphere represents the vacancy an absence of an atom in the diamond lattice.

The NV color center formation and fabrication in DIAMOND is described, for example, in U.S. Pat. No. 4,880,613; and/or J. R. Rabeau et. al. "Implantation of labeled single nitrogen vacancy centers in diamond using $^{15}N$" Applied Physical Letters 88, 023113 (2006), the entire disclosure of which is incorporated herein by reference.

The NV color centers can be found with various concentrations in natural diamond both in type IIa and in type Ib. In order to create NV color centers in diamond, with a controlled concentration and dispersion, usually a type IIa or type Ib natural or synthetic diamond with a very low level up to a very high level of nitrogen content is irradiated by neutron, electrons or ions which creates vacancies in the diamond lattice. These vacancies defuse to nitrogen sites upon annealing in temperature of 600 to 1100 centigrade to create NV color centers, e.g., as shown in FIG. 7b.

In some non-limited examples, the SSAC described herein can be integrated, for example, as a discrete component, e.g., including all of the components of the SSAC.

Figure 8A:
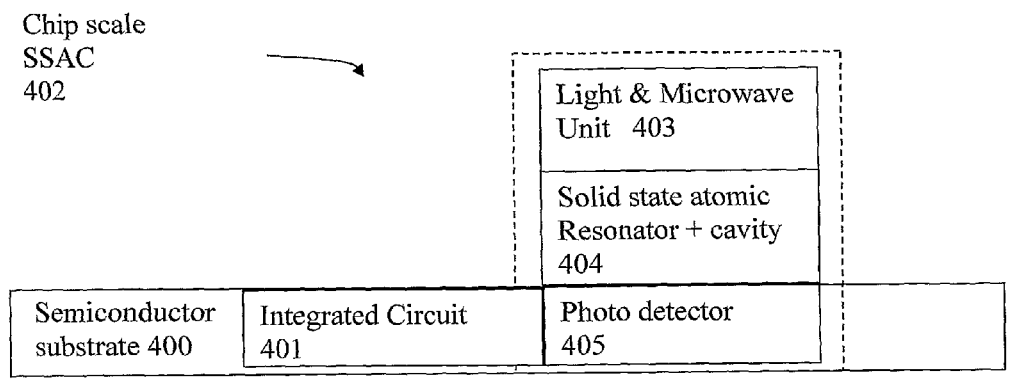
FIG. 8a schematically illustrates a chip including a solid-state atomic clock in accordance with some demonstrative embodiments.
Figure 8B:
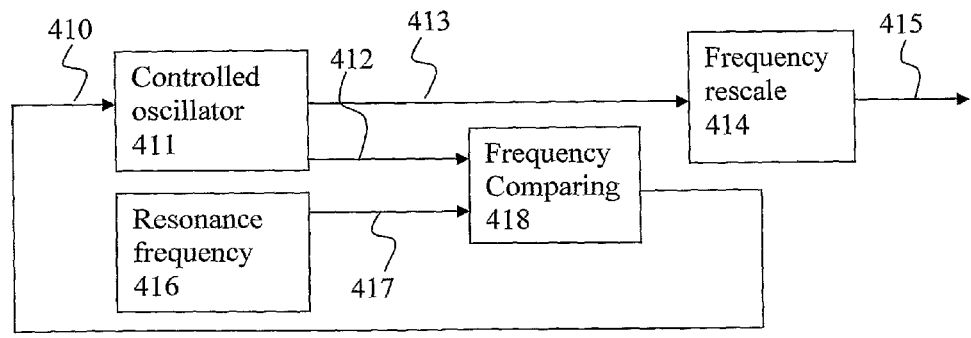
FIG. 8b schematically illustrates a principal method of obtaining a frequency reference standard from atomic resonance in accordance with some demonstrative embodiments.

As shown in FIG. 8a, in one non-limiting example, the atomic clock described herein may be implemented as a chip-scale atomic clock 402. For example, the atomic clock may be integrated as part of a semiconductor chip 400. The semiconductor chip may include the whole set of electronic circuits as integrated circuits 401, e.g., including the photo detector 405 and/or the light source 403 of the atomic clock. The atomic resonator 404 of the atomic clock may be implemented as part of the substrate 400, or inserted on top of the substrate.

The color-center SSAT described herein may have at least one or more of the following advantages, e.g., compared to gas based atomic clocks, e.g., Rb/Cs gas based atomic clocks:

1. No toxic, volatile or other non-hazardous materials are used in the solid-state resonator.

2. The SSAC may not require constant heating of the resonator, and therefore may have lower power consumption, e.g., compared to the gas cell based atomic clock which has to be heated at all times in order to reach a proper operation this result in higher power consumption.

3. The Resonance medium in SSAC may include a solid-state material with size of less then a millimeter square. The manufacturing cost is of such resonator is very low, e.g., compared to the gas cell which has very complicated manufacturing process.

4. The optical excitation wavelength has a wide range, e.g., from 630 nm to less than 450 nm. This may allow the implementation of the light source by low cost solid state VIS light source.

5. The florescence wavelength has a wide range, e.g., from 630 nm to more than 700 nm, which may allow using a low cost Silicone photodetector.

6. Low size—The SSAC resonator may include a solid crystal embedded by color centers, wherein the size of the color center may be few nanometers, such that, for example, in one millimeter square up to 10 can be found. Therefore, the size of the resonator can be less than one micron thick.

7. G-force durability—inherently gases are much more sensitive to G-forces than solids. Applying G-force to gas result in a compression of the gas creating in homogeneous gas density. Therefore, light passing the gas experiencing different atom densities, this leads to intensity instability during this episode. This instability results in instability in the output frequency signal.

8. Aging—The aging in the SSAC, e.g., in diamond based solid-state atomic clock, may be significantly smaller compared to the gas base atomic clock. The atom gas cell is subject to aging due to release of residual gas molecule from the cell walls, adhesives and diffusion. Therefore the purity of the gas mixture is degraded during operation and as a result the performance of the atomic clock is degraded. On the other hand the SSAC may be based on diamond, e.g., as described above, which is one of the most stable materials.

9. No wear-out phenomena associated with Rubidium standards.

10. Very short warm up time, e.g., compared to long worm up time of gas base atomic clock.

11. Low power consumption—in gas resonators the gas cell has to be heated continually in order to achieve proper operation, which results in high power consumption. This may not be required in the SSAC resonator described herein.

Additionally or alternatively, the color-center SSAC described herein may have at least one or more of the following advantages: the material in which the color centers are embedded has a wide optical transparency. Therefore the color center can be addressed by optical means. The quantum state of the color center can be optically prepared and/or readout of the color-center SSAC described herein may have a reduced degree of sensitivity to electrical noise.

Additionally or alternatively, the color-center SSAC described herein may have at least one or more of the following advantages, e.g., compared to OCXO (Oven Controlled Crystal Oscillator) clocks, e.g., the Vectron TC-140 Temperature Compensated Quartz Crystal Oscillator:

1. Higher temperature stability than that of the OCXO.
2. Improve Long term frequency stability (Over long periods of time—days, week or months—their frequency will drift around).
3. Lower power consumption.
4. Smaller size.
5. Lower cost—the OCXO has low manufacturing yield of the resonator.
6. G-shock under applied external acceleration the quarts crystal is subject to a Newtonian force. This force will change and deform the quartz crystal as a result in an error in the output frequency, which is directly derived from the physical dimension of the crystal, will occur.
7. Aging—long term deformation, change in the internal strain and mass diffusion results in the change of the resonance frequency of the OCXO resonator.
8. Short worm up time.

Some embodiments may include an atomic clock frequency generator ("the Solid State Atomic Clock (SSAC)") to generate an accurate and/or stable output frequency based, for example, on an atomic resonance in the solid state material, e.g., as described below. The SSAC may be implemented as part of any suitable device, module, element, and/or system, e.g., as described below.

Figure 8C:
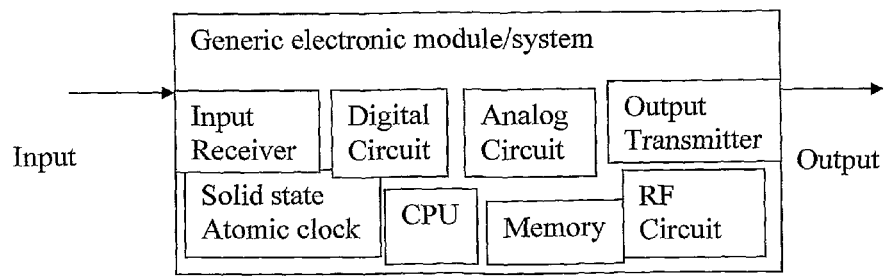
FIG. 8c schematically illustrates a generic electronic module and/or system utilizes a solid state atomic clock in accordance with some demonstrative embodiments.

A generic electronic module and/or system utilizing a frequency standard SSAC is schematically illustrated in FIG. 8c. the module and/or the system comprising a input circuit which receives the input data, an output circuit which transmitter the output dada, a central processing unit (CPU), a memory unit, RF circuit, analog and/or digital circuits and a solid state atomic clock. This electronic module and/system can serves as a whole or in part to implement each of the applications describes below.

Figure 9A:
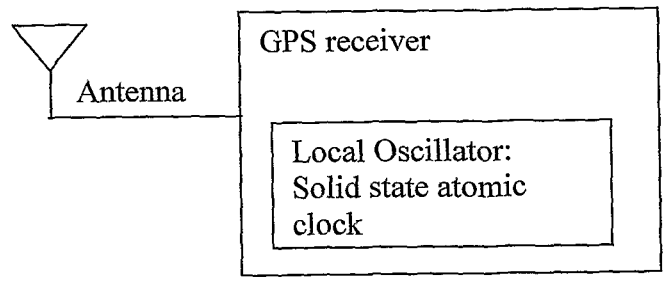
FIG. 9a schematically illustrates a GPS receiver in accordance with some demonstrative embodiments.

FIG. 9a schematically illustrates a Global Positioning System (GPS) in accordance with some demonstrative embodiments. Global positioning systems may require very high clock accuracy in order to acquire a system position. This accurate frequency can be stored by, provided by high accuracy local oscillator or frequency standard or SSAC, or retrieved from one of the GPS satellites; however it is not immune to jamming and other interferences a high accuracy local oscillator or frequency standard is requires in order to hold the reference frequency and to improve synchronization of the receiver. In portable anti jam GPS applications small size, low power consumption and low cost frequency reference is required. Such high accuracy, small size, low power consumption and low cost local frequency reference oscillator or frequency standard can be realized by a SSAC e.g., as is described herein.

Figure 9B:
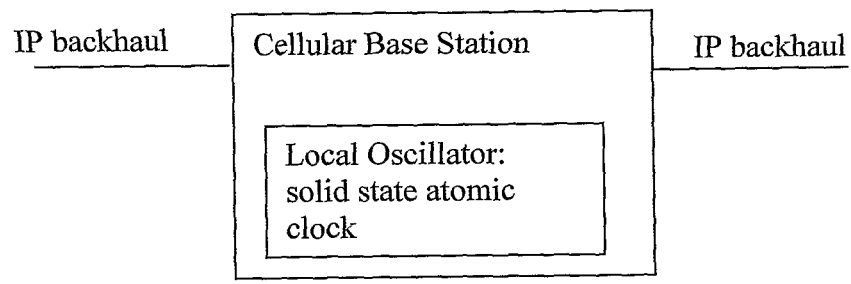
FIG. 9b schematically illustrates a cellular base station in accordance with some demonstrative embodiments.

FIG. 9b schematically illustrates a cellular base station in accordance with some demonstrative embodiments. Cellular base station may use a frequency standard for example but limited to, holdover of cellular handset between base stations. Moreover, modern Base Station Backhaul may be based on Internet protocol (IP) backhaul, maintaining high service level assurance precise frequency distribution throughout the network is required. The transmission of voice, video and data in mobile networks requires a stable and precise frequency reference, and precise frequency synchronization is critical for the successful call signal hand-off between base stations. One possible solution for maintaining such stable and precise frequency reference is by employing a SSAC, e.g., as described herein.

Figure 9C:
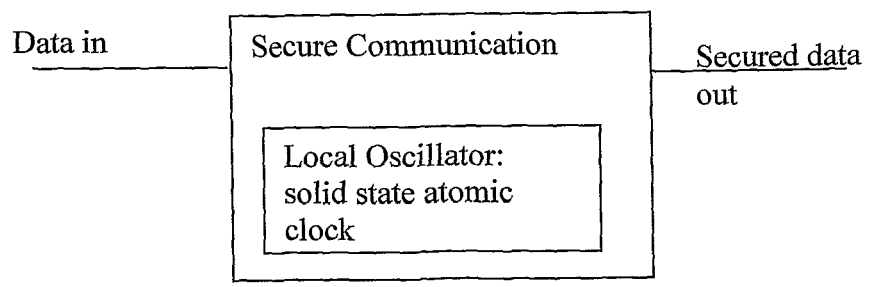
FIG. 9c schematically illustrates a secure communication system in accordance with some demonstrative embodiments.

FIG. 9c schematically illustrates a secure communication system in accordance with some demonstrative embodiments. It can use, but mot limited to for example a "time sequence code acquisition" for secure communication or any other method for secure communication based on precise timing. A secure communications system may use very accurate frequency for encryption of the information and the communication. One possible solution for maintaining such stable and precise frequency reference is by employing a SSAC, e.g., as described herein.

Figure 10A:
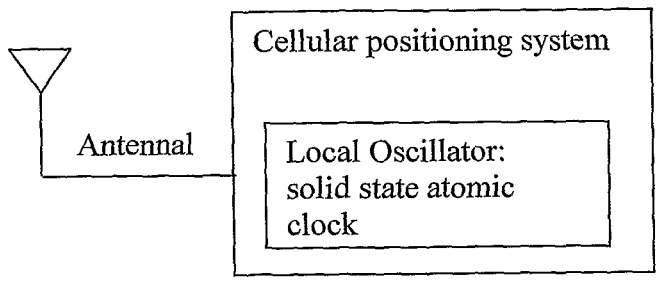
FIG. 10a schematically illustrates a cellular positioning system in accordance with some demonstrative embodiments.

FIG. 10a schematically illustrates a cellular positioning system in accordance with some demonstrative embodiments. A Cellular positioning system may use high accuracy frequency to determine the distance between the cellular receiver and the cellular base station by measuring the Time of Arrival (TOA) of an electromagnetic pulse between the base station an the cellular receiver. One possible solution for maintaining such stable and precise frequency reference is by employing a SSAC, e.g., as described herein.

Figure 10B:
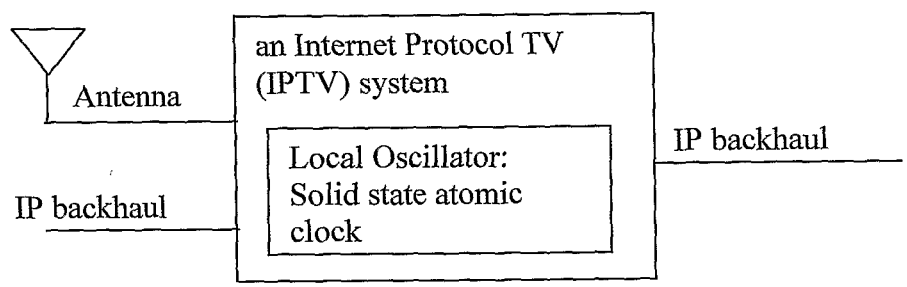
FIG. 10b schematically illustrates an Internet Protocol TV (IPTV) system in accordance with some demonstrative embodiments.

FIG. 10b schematically illustrates an Internet Protocol TV (IPTV) system in accordance with some demonstrative embodiments. An IPTV broadcast is based on Internet protocol (IP) backhaul, maintaining high service level assurance therefore, a precise frequency distribution throughout the network is required. The transmission of video and data in IP networks requires a stable and precise frequency reference, and precise frequency synchronization is critical for the successful timing reconstruction of the video signals in servers and network switches as well as at the end user system. One possible solution for maintaining such stable and precise frequency reference is by employing a e.g., as described herein.

Figure 10C:
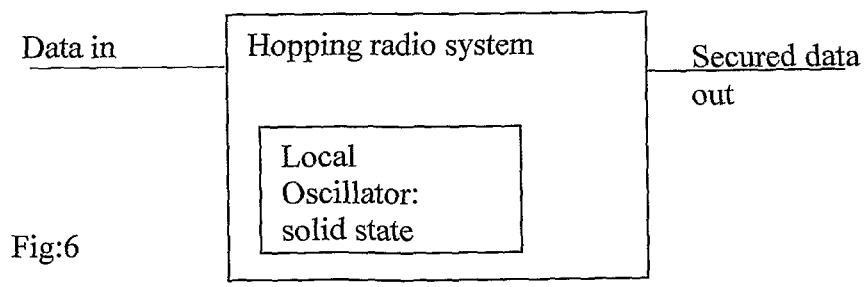
FIG. 10c schematically illustrates a hopping radio system in accordance with some demonstrative embodiments.

FIG. 10c schematically illustrates spread spectrum hopping radio communication system in accordance with some demonstrative embodiments. Very fast frequency hopping radio communication may include any suitable radio communication system, which sends the data over a wideband of frequencies by hopping between different frequencies. In very fast frequency hopping radio communication the radio receiver and transmitter should be frequency synchronized for long periods of time with out actively synchronization between the two radio systems. Such a radio system can be a military radio, civilian radio, wireless radio communication, cellular communication, WiMax, WiFi, spread spectrum communication or any other hopping radio communication. One possible solution for maintaining such stable and precise frequency reference is by employing a SSAC, e.g., as described herein.

Figure 11A:
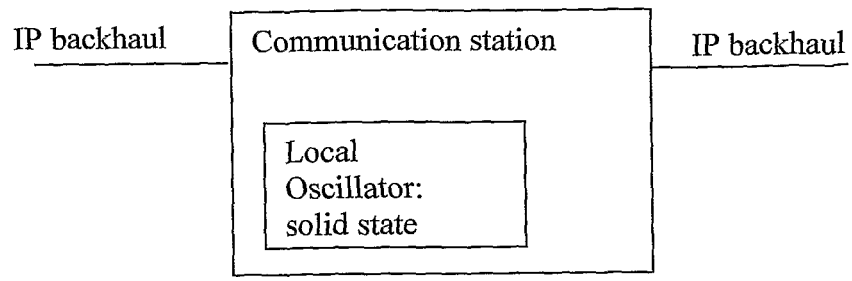
FIG. 11a schematically illustrates a communication station in accordance with some demonstrative embodiments.

FIG. 11a schematically illustrates a communication station in accordance with some demonstrative embodiments. Communication networks require maintaining a precise frequency distribution throughout the network. The transmission of voice, video and data in mobile networks requires a stable and precise frequency reference, and precise frequency synchronization and holding is critical for the successful communication between stations. One possible solution for maintaining such stable and precise frequency reference is by employing a SSAC, e.g., as described herein.

Figure 11B:
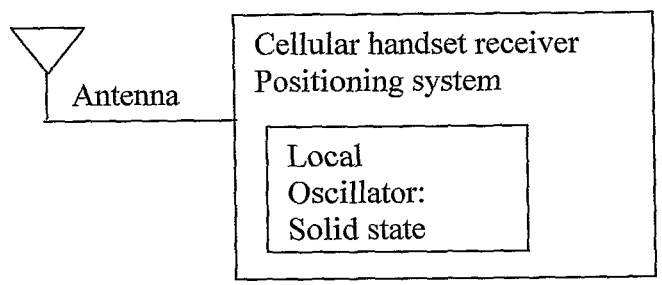
FIG. 11b schematically illustrates cellular handset receiver with a positioning system in accordance with some demonstrative embodiments.

FIG. 11b schematically illustrates a cellular handset receiver with a positioning and/or range measuring system in accordance with some demonstrative embodiments. A range finding system, velocity measurement system on a cellular handset may use high accuracy frequency to determine the distance between the transmitter/receiver and the object by Time of Arrival (TOA) algorithm or any other algorithm, and/or highly accurate clock may be use for hold over proposes. One possible solution for maintaining such stable and precise frequency reference is by employing a SSAT, e.g., as described herein.

Figure 11C:
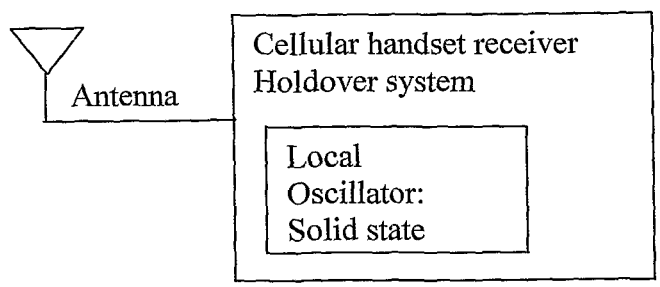
FIG. 11c schematically illustrates a cellular handset receiver with a holdover system in accordance with some demonstrative embodiments.

FIG. 11c schematically illustrates cellular handset receiver with a holdover system in accordance with some demonstrative embodiments. Holdover system between two base stations of cellular system on a cellular handset may use high accuracy frequency to determine the distance between the transmitter/receiver and the object by Time of Arrival (TOA) algorithm or any other algorithm, and/or highly accurate clock may be use for hold over proposes. A possible solution for maintaining such stable and precise frequency reference is by employing a SSAC, e.g., as described herein.

Figure 12A:
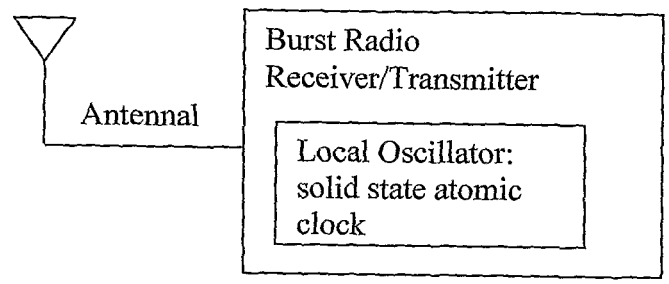
FIG. 12a schematically illustrates a burst radio communication system in accordance with some demonstrative embodiments.

FIG. 12a schematically illustrates a burst radio communication system in accordance with some demonstrative embodiments. Burst radio communication may include any suitable radio communication system, which sends bursts of voice, video or data over a radio frequency. In this type of systems the radio receiver and transmitter should have precise frequency synchronization for long periods of time with out actively synchronization between the two radio systems. Such a radio system can be a military radio, civilian radio, wireless radio communication, cellular communication or any other hopping radio communication. One possible solution for maintaining such stable and precise frequency reference is by employing a SSAC, e.g., as described herein.

Figure 12B:
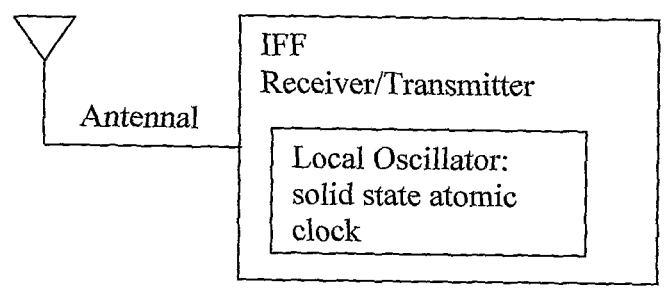
FIG. 12b schematically illustrates an Identification Friend or Foe (IFF) module in accordance with some demonstrative embodiments.

FIG. 12b schematically illustrates an Identification Friend or Foe (IFF) module in accordance with some demonstrative embodiments. An IFF system using radio communication, e.g., to identify a flying aircraft, may use high accuracy frequency for the radio communication. One possible solution for maintaining such stable and precise frequency reference is by employing a SSAC, e.g., as described herein.

Figure 12C:
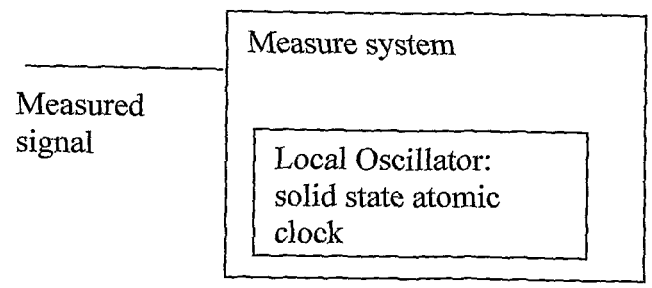
FIG. 12c schematically illustrates a measuring module and/or measuring system in accordance with some demonstrative embodiments.

FIG. 12c schematically illustrates a measuring system in accordance with some demonstrative embodiments. In a measuring system for example jitter/wonder measuring, radio frequency measurement systems, or other measuring systems, need a high accuracy frequency time base. One possible solution for maintaining such stable and precise frequency reference is by employing a SSAC, e.g., as described herein.

Figure 13A:
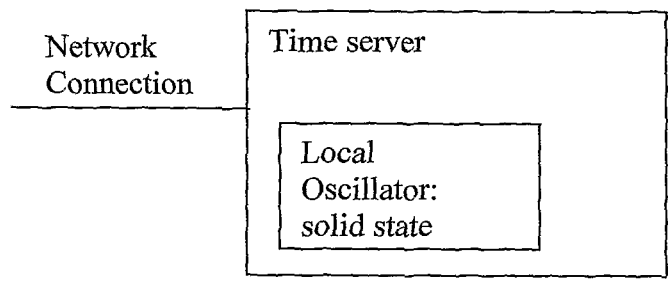
FIG. 13a schematically illustrates a time-server in accordance with some demonstrative embodiments.

FIG. 13a schematically illustrates a time-server in accordance with some demonstrative embodiments. A time-server may include any suitable a communication network component with precise time keeping ability. The time-server may be connected to the communication network and it can send time indicator to other components of the network. The time-server can be a stand-alone or embedded in to another system in the network such servers, switches or hubs. One possible solution for maintaining such stable and precise frequency reference is by employing a SSAC, e.g., as described herein.

Figure 13B:
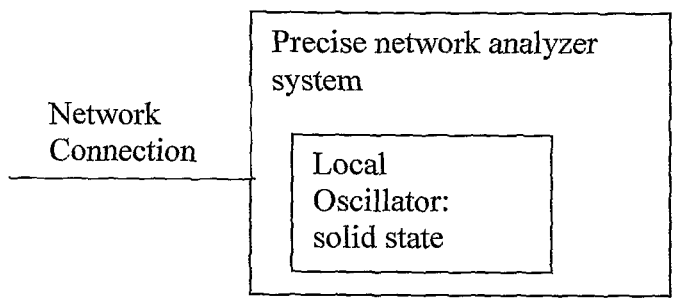
FIG. 13b schematically illustrates a precise network analyzer system in accordance with some demonstrative embodiments.

FIG. 13b schematically illustrates a precise network analyzer system in accordance with some demonstrative embodiments. The precise network measuring system may include any suitable communication network component, which monitors the performance of the communication network in order to measure Quality of the service including intrusion detection, lost of packets and other requirements. The system may require precise time keeping ability to log precisely any occurring event in the network. The system is connected to the communication network and can be a stand alone or embedded in to other systems in the network such servers, switches or hubs. One possible solution for maintaining such stable and precise frequency reference is by employing a SSAC, e.g., as described herein.

Figure 13C:
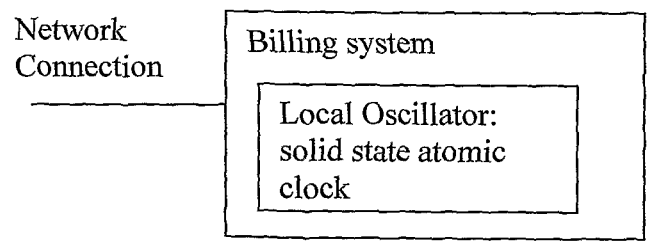
FIG. 13c schematically illustrates a billing system in accordance with some demonstrative embodiments.

FIG. 13c schematically illustrates a billing system in accordance with some demonstrative embodiments. A network communication billing system may include any suitable communication network component, which monitors the traffic of the communication network in order to bill for the service and usage. The system may require precise time keeping ability to log precisely any usage of the network. The system is connected to the communication network and can be a stand alone or embedded in to other systems in the network such servers, switches or hubs. One possible solution for maintaining such stable and precise frequency reference is by employing a SSAC, e.g., as described herein.

Figure 14A:
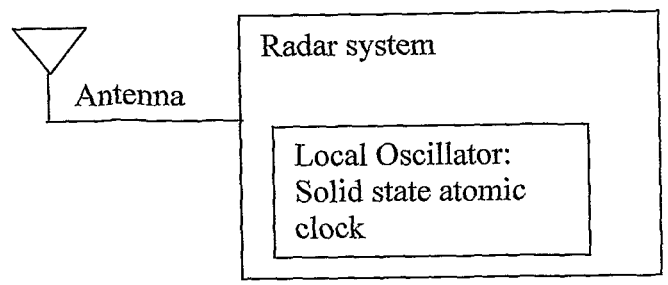
FIG. 14a schematically illustrates a radar system in accordance with some demonstrative embodiments.

FIG. 14a schematically illustrates a radar system in accordance with some demonstrative embodiments. The radar system may measure the direction, distance and/or velocity of an object by Time of Arrival (TOA) of an echo radio wave signal. High accuracy frequency source is used to determine the TOA. One possible solution for maintaining such stable and precise frequency reference is by employing a SSAC, e.g., as described herein.

Figure 14B:
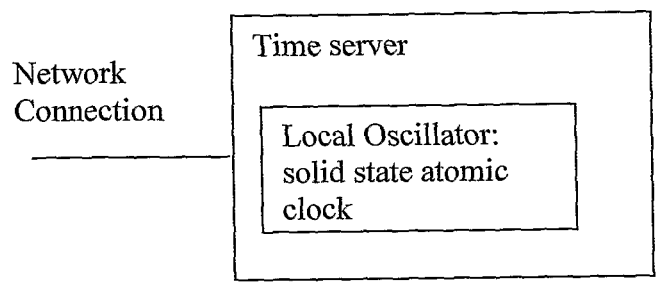
FIG. 14b schematically illustrates a time-server in accordance with some demonstrative embodiments.

FIG. 14b schematically illustrates a time-server in accordance with some demonstrative embodiments. A time stamp server may include any suitable communication network component with precise time keeping ability. The time stamp server is connected to the communication network and it can send time stamp to other users or components of the network and/or for other local applications in the system, for accurate time marking. The time stamp server can be a stand-alone module or embedded into another system in the network such servers, switches or hubs. This time stamp can be used for finance transaction time marking, B2B time marking, invoice time marking, billing time marking or any other application which requires time marking. One possible solution for maintaining such stable and precise frequency reference is by employing a SSAC, e.g., as described herein.

Figure 14C:
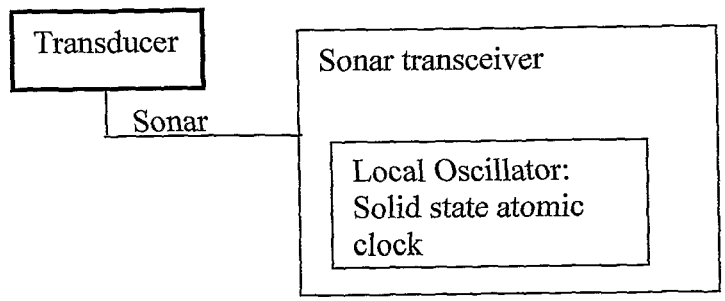
FIG. 14c schematically illustrates a sonar system in accordance with some demonstrative embodiments.

FIG. 14c schematically illustrates a sonar system in accordance with some demonstrative embodiments. The sonar system may measure the direction, distance and/or velocity of an object by Time of Arrival (TOA) of an echo of a sound wave signal. High accuracy frequency source is used to determine the TOA. One possible solution for maintaining such stable and precise frequency reference is by employing a SSAC, e.g., as described herein.

Some embodiments may be related to one or more of the following references, the entire disclosures of which are incorporated herein by reference:

P. Misra and M. Pratt, Role of the Clock in a GPS Navigation Receiver, ATC Project Memorandum. No. 42PM-SAT-NAV-0008, Massachusetts Institute of Technology, Lincoln Laboratory (May 1994).

M. A. Sturza, GPS Navigation using Three Satellites and a Precise Clock, Global Positioning Systems, vol. II, Washington, D.C.: The Institute of Navigation, pp. 122-131 (1984).

J. H. Murphy and T. A. Skidmore; A Low-Cost Atomic Clock: Impact on the National Airspace and GNSS Availability; Proceedings of IONGPS-94; Salt Lake Convention Center, Salt Lake City, Utah Sep. 20-23, 1994; pp. 1-8.

J. Vig, "Military applications of high-accuracy frequency standards and clocks," 40, 522-527 (1993).

H. Fruehoff, "Fast "direct-P(Y)" GPS signal acquisition using a special portable clock," in Pro.c 33rd Ann.

Precise Time and Time Interval (PTTI) Systems and Applications Meeting, Long Beach, Calif., November 27-29, 359-369 (2001).

J. A. Kusters and C. A. Adams, "Performance requirements of communication base station time standards," RF design, 28-38 (1999).

L. Liew, S. Knappe, J. Moreland, H. G. Robinson, L. Hollberg, and J. Kitching, "Microfabricated alkali atom vapor cells," Appl. Phys. Lett. 48, 2694-2696 (2004).

S. Knappe, V. Velichansky, H. G. Robinson, L. Liew, J. Moreland, J. Kitching, and L. Hollberg, "Atomic Vapor Cells for Miniature Frequency References," in Proc. of the 2003 IEEE International Frequency Control Symposium and PDA Exhibition Jointly with the 17th European Frequency and Time Forum, (Institute of Electrical and Electronics Engineers, New York, 2003), 31-32.

E. Arimondo, "Coherent population trapping in laser spectroscopy," in, Progress in Optics XXXV, E. Wolf, eds. (Elsevier, Amsterdam, 1996), pp. 257-354.

M. Stabler, R. Wynands, S. Knappe, J. Kitching, L. Hollberg, A. Taichenachev, V. Yudin, "Coherent population trapping resonances in thermal Rb-85 vapor: D-1 versus D-2 line excitation," Opt. Lett. 27, 1472-1474 (2002).

N. Cyr, M. Tetu, and M. Breton, "All-Optical Microwave Frequency Standard—a Proposal," *IEEE Transactions on Instrumentation and Measurement*, vol. 42, pp. 640-649, 1993.

J. Kitching, S. Knappe, N. Vukicevic, L. Hollberg, R. Wynands, and W. Weidmann, "A microwave frequency reference based on VCSEL-driven dark line resonances in Cs vapor," *IEEE Transactions on Instrumentation and Measurement*, vol. 49, pp. 1313-1317, 2000.

M. Merimaa, T. Lindvall, I. Tittonen, and E. Ikonen, "All-optical atomic clock based on coherent population trapping in Rb-85," *Journal of the Optical Society of America B-Optical Physics*, vol. 20, pp. 273-279, 2003.

J. Kitching, S. Knappe, and L. Hollberg, "Miniature vapor-cell atomic-frequency references," *Applied Physics Letters*, vol. 81, pp. 553-555, 2002.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid-state memory, magnetic tape, a removable computer diskette, a random access memory (RAM), a read-only memory (ROM), a rigid magnetic disk, and an optical disk. Some demonstrative examples of optical disks include compact disk—read only memory (CD-ROM), compact disk—read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of embodiments of the invention have been illustrated and described herein, many modifications, substitutions, changes, and equivalents may occur to those skilled in the art. It is, therefore, to be understood that the appended claims are intended to cover all such modifications and changes.

What is claimed is:

1. A device comprising:
   a solid-state atomic clock to generate a clock frequency signal, the solid-state atomic clock comprising:
      a solid state atomic resonator formed by a solid-state material including an optical cavity having color centers, which are capable of exhibiting hyperfine transition,
   wherein the solid-state atomic clock generates the clock frequency signal based on a hyperfine resonance frequency of said color centers.

2. The device of claim 1, wherein the solid-state atomic clock includes a solid-state atomic resonator module including the solid state atomic resonator,
   wherein the solid-state atomic resonator module is configured to receive an input frequency signal, which is based on said clock frequency signal,
   and wherein the solid-state atomic resonator module is configured to generate an error frequency signal proportional to a difference between the input frequency signal and the hyperfine resonance frequency of said color centers.

3. The device of claim 2, wherein the solid-state atomic clock comprises:
   a feedback circuit configured to generate an error-correction signal based on the error frequency signal provided by said solid-state atomic resonator module;
   a controlled oscillator configured to generate said clock frequency signal based on said error-correction signal; and
   a frequency multiplier configured to generate said input frequency signal to said solid-state atomic resonator module by multiplying a frequency of said clock frequency signal.

4. The device of claim 2, wherein the solid-state atomic resonator module comprises a light source configured to generate light for illuminating said solid-state atomic resonator, and a photo detector to generate the error frequency signal based on detected photo-luminescence of said color centers.

5. The device of claim 4, wherein the solid state atomic resonator module comprises a microwave element configured to transmit a microwave electromagnetic wave upon said solid state atomic resonator, the microwave electromagnetic wave has a frequency, which is based on the input frequency signal to said solid-state atomic resonator module.

6. The device claim 4, wherein the solid state atomic resonator module comprises a modulated coherent light source configured to generate the light for illuminating said solid-state atomic resonator based on said input frequency signal to said solid-state atomic resonator module.

7. The device of claim 1, wherein said solid-state material comprises diamond, and wherein the color centers comprise Nitrogen-Vacancy color centers in said diamond.

8. The device of claim 1, wherein said solid-state material comprises:
   at least one diamond crystal embedded by Nitrogen-Vacancy color centers.

9. The device of claim 8, wherein said at least one diamond crystal comprises
   a plurality of diamond nano-crystals.

10. The device of claim 1, wherein the optical cavity is formed by a plurality of bragg reflectors.

11. The device of claim 1, wherein the optical cavity is formed by a photonic crystal structure.

12. The device of claim 1, wherein the solid-state atomic resonator module comprises a magnetic shield encircling the atomic resonator.

13. The device of claim 1 comprising an integrated circuit including said solid-state atomic clock.

14. The device of claim 1, wherein said solid-state atomic clock is integrated on a single semiconductor substrate.

15. A method of obtaining a frequency reference, the method comprising:
   illuminating a solid state atomic resonator formed by a solid-state material including an optical cavity having color centers, such that the color centers exhibit hyperfine transition; and
   generating a clock frequency signal based on a hyperfine resonance frequency of said color centers.

16. The method of claim 15 comprising:
   determining an error frequency based on the clock frequency signal and the hyperfine resonance frequency of said color centers; and
   adjusting said clock frequency signal based on said error frequency.

17. The method of claim 16 comprising generating an input frequency signal to said solid state atomic resonator based on said clock frequency signal, wherein determining the error frequency comprises determining the error frequency based on a difference between the input frequency signal and the hyperfine resonance frequency of said color centers.

18. The method of claim 15, wherein said solid-state material comprises diamond, and wherein the color centers comprise Nitrogen-Vacancy color centers in said diamond.

19. The method of claim 15, wherein said solid-state material comprises:
   at least one diamond crystal embedded by Nitrogen-Vacancy color centers.

20. The method of claim 19, wherein said at least one diamond crystal comprises a diamond plurality of nano-crystals.

21. The method of claim 15, wherein the optical cavity is formed by a plurality of bragg reflectors.

22. The method of claim 15, wherein the optical cavity is formed by a photonic crystal structure.

23. The method of claim 15 comprising receiving said clock frequency signal and performing an operation based on the clock frequency signal.

24. A system comprising:
   at least one electronic device including:
      a solid-state atomic clock to generate a clock frequency signal, the solid-state atomic clock comprising:
         a solid state atomic resonator formed by a solid-state material including an optical cavity having color centers, which are capable of exhibiting hyperfine transition,
         wherein the solid-state atomic clock generates the clock frequency signal based on a hyperfine resonance frequency of said color centers; and
      at least one electronic module to receive said clock frequency signal and perform an operation based on the clock frequency signal.

25. The system of claim 24, wherein the solid-state atomic clock includes a solid-state atomic resonator module including the solid state atomic resonator,
   wherein the solid-state atomic resonator module is configured to receive an input frequency signal, which is based on said clock frequency signal,
   and wherein the solid-state atomic resonator module is configured to generate an error frequency signal proportional to a difference between the input frequency signal and the hyperfine resonance frequency of said color centers.

26. The system of claim 25, wherein the solid-state atomic clock comprises:
- a feedback circuit configured to generate an error-correction signal based on the error frequency signal provided by said solid-state atomic resonator module;
- controlled oscillator configured to generate said clock frequency signal based on said error-correction signal; and
- a frequency multiplier configured to generate said input frequency signal to said solid-state atomic resonator module by multiplying a frequency of said clock frequency signal.

27. The system of claim 25, wherein the solid-state atomic resonator module comprises a light source configured to generate light for illuminating said solid-state atomic resonator and a photo detector to generate the error frequency signal based on detected photo-luminescence of said color centers.

28. The system of claim 24, wherein said solid-state material comprises diamond, and wherein the color centers comprise Nitrogen-Vacancy color centers in said diamond.

29. The system of claim 24 comprising an integrated circuit including said solid-state atomic clock.

\* \* \* \* \*